United States Patent [19]
Tanaka et al.

[11] Patent Number: 5,444,662
[45] Date of Patent: Aug. 22, 1995

[54] DYNAMIC RANDOM ACCESS MEMORY WITH BIT LINE EQUALIZING MEANS

[75] Inventors: Takayuki Tanaka; Yoshimasa Sekino; Yoshihiro Murashima; Yasuhiro Tokunaga; Joji Ueno; Takeru Yonaga, all of Tokyo, Japan

[73] Assignee: Oki Electric Industry Co., Ltd., Tokyo, Japan

[21] Appl. No.: 257,450

[22] Filed: Jun. 8, 1994

Related U.S. Application Data

[63] Continuation of Ser. No. 985,192, Dec. 3, 1992, abandoned.

[30] Foreign Application Priority Data

Dec. 4, 1991 [JP] Japan .................. 3-320539

[51] Int. Cl.[6] .............................. G11C 7/00
[52] U.S. Cl. .................. 365/203; 365/205; 365/207; 365/202
[58] Field of Search ............... 365/203, 149, 205, 190, 365/207, 208, 202

[56] References Cited

U.S. PATENT DOCUMENTS

| | | | |
|---|---|---|---|
| 5,058,072 | 10/1991 | Kashimura | 365/203 |
| 5,068,831 | 11/1991 | Hoshi et al. | 365/203 |
| 5,202,854 | 4/1993 | Koike | 365/203 |
| 5,235,547 | 8/1993 | Kobayashi | 365/190 |

Primary Examiner—Joseph A. Popek
Assistant Examiner—Tan Nguyen
Attorney, Agent, or Firm—Spencer, Frank & Schneider

[57] ABSTRACT

A dynamic random access memory of the complementary MOS transistor type has memory cells connected between complementary bit lines on one side of a pair of transfer gates and a sense amplifier connected to nodes on the other side of the transfer gates, so that the sense amplifier can be connected to the bit lines and memory cells through the pair of transfer gates. A sense amplifier equalizing circuit and a bit line equalizing circuit are provided on opposite sides of the transfer gates so that the potentials on the bit lines can be equalized independently of equalization of the potentials on the nodes. Accordingly, there is no delay in the equalization due to the transfer gates connecting the nodes to the bit lines. According to another aspect of the invention, the transfer gates each include a pair of MOSFET transistors connected to each other in parallel, wherein one transistor of each pair of MOSFET transistors is an n-channel MOSFET transistor and the other transistor of each pair of MOSFET transistors is a p-channel MOSFET transistor. By, for example, connecting the gate of the NMOS transistor of each transfer to the power source and connecting the gate of each PMOS transistor to the ground, it is possible to prevent erroneous operation of the DRAM from a drop in the gate potential.

10 Claims, 16 Drawing Sheets

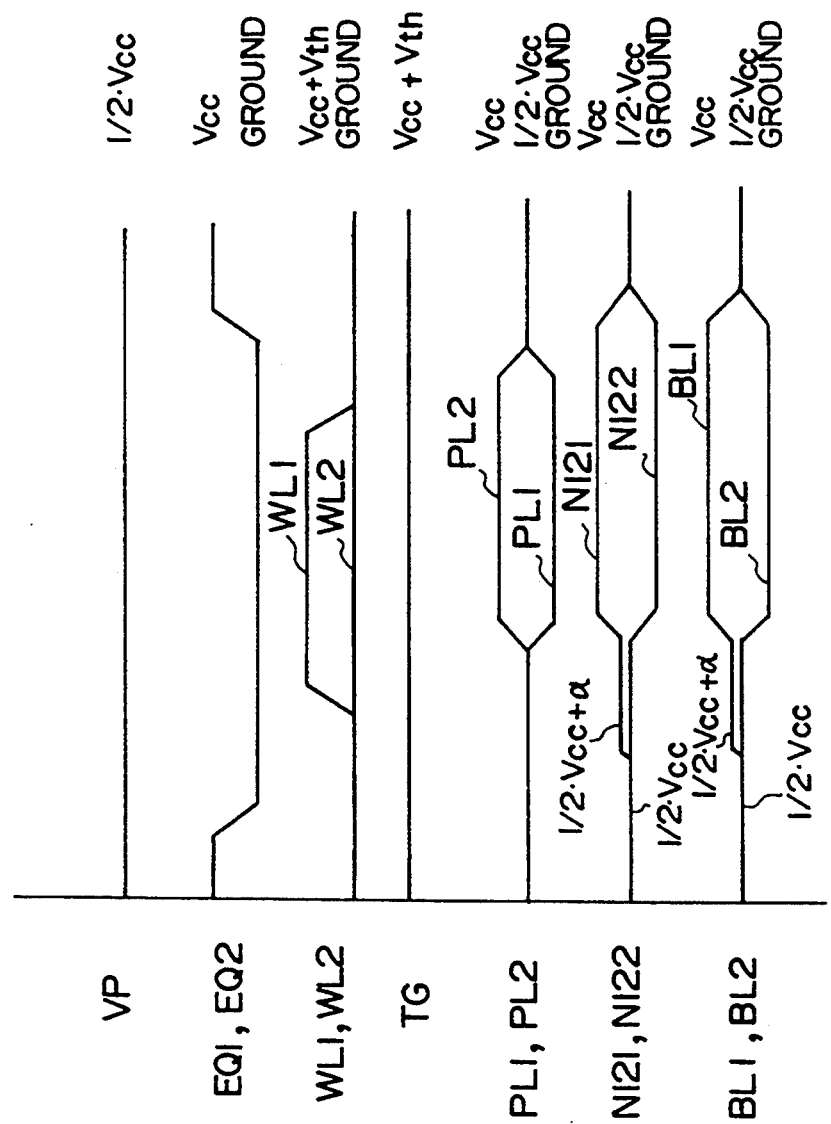

DYNAMIC RANDOM ACCESS MEMORY WITH BIT LINE EQUALIZING MEANS

This application is a continuation of application Ser. No. 07/985,192, filed Dec. 3, 1992, now abandoned.

CROSS-REFERENCE TO RELATED APPLICATIONS

This application claims priority rights under 35 USC §119 of Japanese Patent Application No. 320539, filed Dec. 4, 1991, the entire disclosure of which is incorporated herein by reference.

BACKGROUND OF THE INVENTION

1. Field of the Invention

The invention relates to a dynamic random access memory (DRAM) using the capacitance of the gate of a MOS field effect transistor (MOSFET).

2. Description of the Related Art

FIG. 2 is a circuit diagram which shows a typical arrangement of memory cells and a sense amplifier circuit in a conventional DRAM.

The DRAM of FIG. 2 employs complementary MOS (CMOS) technology and has intersecting pairs of complementary bit lines BL1, BL2 and word lines WL1, WL2, to which memory cells 10 are connected. Memory cells 10 are depicted in FIG. 2 as two dynamic memory cells 11, 12, corresponding to two memory bits.

Each of the memory cells 11, 12 is composed of a charge transfer n-channel (N-type) enhancement mode MOSFET transistor (hereinafter "NMOS transistor"), identified respectively by reference numerals 11a, 12a. Each of the NMOS transistors has a drain and a gate which are connected, respectively, to the bit lines BL1, BL2 and the word lines WL1, WL2, and capacitors 11b, 12b which are connected, respectively, between the sources of the NMOS transistors 11a, 12a and a line carrying an internally generated equalizing potential VP.

The bit line BL1 is connected to a first node N21 through a first transfer gate, such as a NMOS transistor 21. Likewise, the bit line BL2 is connected to a second node N22 through a second transfer gate, such as NMOS transistor 22. NMOS transistors 21,22 are controlled by a transfer signal TG. A sense amplifier circuit 30 and a sense amplifier equalizing circuit 40 are connected between the first and second nodes N21, N22, which nodes may be considered to be common to the equalizing circuit 40.

The sense amplifier circuit 30 includes a N-type sense amplifier 30N which, when activated by a first active signal PL1, detects and amplifies a potential difference existing between the first and second nodes N21, N22 when the potential on the node N21 exceeds the potential on node N22. Sense amplifier circuit 30 also includes a P-type sense amplifier 30P which, when activated by a second active signal PL2, detects and amplifies a potential difference existing between the nodes when the potential on the node N22 exceeds the potential on node N21. The N-type sense amplifier 30N comprises two NMOS transistors 31,32. The sources of NMOS transistors 31,32 are both connected to the first active signal PL1, while the drains and gates of NMOS transistors 31,32 are cross-connected between the first and second nodes N21, N22. The P-type sense amplifier 30P comprises two p-channel (P-type) enhancement mode MOSFET transistors (hereinafter "PMOS transistors"), identified respectively by reference numerals 33, 34. The sources of PMOS transistors 33, 34 are both connected to the second active signal PL2, while the drains and gates of PMOS transistors 33, 34 are cross-connected between the first and second nodes N21, N22.

The sense amplifier equalizing circuit 40, when activated by a first equalization signal EQ1, sets the potential on the first and second nodes N21, N22 to an equalizing potential VP. The equalizing circuit 40 is composed of NMOS transistors 41,42, 43, all of which are gate-controlled by the first equalization signal EQ1. The drains of the NMOS transistors 41,42 are connected, respectively, to the first and second nodes N21, N22. The drain and source of the NMOS transistor 43 are also respectively connected to the nodes N21 and N22.

FIG. 3 is a waveform diagram useful for understanding operation of the circuitry shown in FIG. 2.

In this example, the equalizing potential VP is an internally generated voltage level of $\frac{1}{2}$.Vcc, where Vcc is an external power source potential. As shown in FIG. 3, the transfer signal TG has a level higher than Vcc+Vth, where Vth is the gate threshold level of NMOS transistors 21 and 22. Therefore, these transfer gates 21 and 22 are conducting.

To reset the DRAM, the level of the equalization signal EQ1 is set to Vcc, the potential on the word lines WL1, WL2 is set to ground level, and the levels of the first and second active signals PL1, PL2 are set to $\frac{1}{2}$. The equalizing potential VP (=$\frac{1}{2}$.Vcc) therefore is applied to the nodes N21, N22, through the conducting NMOS transistors 41,42 of the equalizing circuit 40. Further, the bit lines BL1, BL2 are connected to the nodes N21, N22, respectively, through the conducting NMOS transistors 21,22, so that the bit lines also have a potential of $\frac{1}{2}$.Vcc.

The read-out and refresh operations for the memory cell 11, when it holds a data value, for example, a logic level "1" (corresponding to when the node N11 is at the level of Vcc), will now be described.

For the read-out operation, the level of the equalization signal EQ1 is set to the ground level, such that NMOS transistors 41,42, 43 of the equalizing circuit 40 are turned off. The potential on the word line WL1 is shifted from the ground level to a level higher than Vcc+Vth, thus connecting the node N11 to the bit line BL1, through the NMOS transistor 11a of the memory cell 11. In response, a redistribution of charge occurs, based on the capacitance 11b and the capacitance of the bit line BL1. As a result, the potential of the bit line BL1 rises from $\frac{1}{2}$.Vcc to $\frac{1}{2}$.Vcc+$\alpha$. The potential on the bit line BL2 remains at $\frac{1}{2}$.Vcc. Accordingly, the potential on the node N21 is shifted to $\frac{1}{2}$.Vcc+$\alpha$, through the conducting transfer gate NMOS transistor 21, while the potential on the node N22 remains at the level of $\frac{1}{2}$.Vcc.

Next, the level of the first active signal PL1 is shifted from $\frac{1}{2}$.Vcc to ground level, while the level of the second active signal PL2 is shifted from $\frac{1}{2}$.Vcc to Vcc, thereby activating the sense amplifier circuit 30. When the sense amplifier circuit 30 is activated, the potential on the node N21 is shifted from the $\frac{1}{2}$.Vcc+$\alpha$ level to the Vcc level, and the potential on the node 22 is shifted from $\frac{1}{2}$.Vcc to the ground level. As a result, the potential on the bit line BL1 is shifted from the $\frac{1}{2}$.Vcc+$\alpha$ level to the Vcc level, through the conducting NMOS transistor 21, and the potential on the bit line BL2 is shifted from $\frac{1}{2}$.Vcc to the ground level, through the conducting NMOS transistor 22. Throughout this operation, the transfer signal TG is maintained at a level higher than Vcc+Vth, so that NMOS transistors 21 and 22 conduct, and the potential on the bit lines BL1 and BL2 can be shifted to Vcc and ground, respectively.

Thereafter, the nodes N21, N22, or the bit lines BL1, BL2, are connected to a pair of data busses (not shown), by an output from a column decoder (not shown), and the stored data is outputted externally to complete the read-out operation. Further, since the potential on the word line WL1 is set to a level higher than Vcc+Vth, NMOS transistor 11a of the memory cell 11 is turned on (conductive). As a result, the potential on the node N11 returns to the Vcc level (the level on the bit line BL1), thus completing the refresh operation.

FIG. 4 is a circuit diagram illustrating memory cells and sense amplifier circuits in another conventional DRAM, wherein reference characters common to those in FIG. 2 designate the same elements.

In the DRAM of FIG. 4, instead of the sense amplifier equalizing circuit 40, a bit line equalizing circuit 50 is connected between the bit lines BL1, BL2. This equalizing circuit 50, when activated by a second equalization signal EQ2, sets the potential on the bit lines BL1, BL2 to the equalizing potential VP. The bit line equalizing circuit 50 is composed of NMOS transistors 51, 52, 53, all of which are gate-controlled by the equalization signal EQ2. The sources of the NMOS transistors 51, 52 are connected commonly to the equalizing potential VP. The drains of the NMOS transistors 51,52 are connected, respectively, to the bit lines BL1, BL2. The drain and source of NMOS transistor 53 are also respectively connected to the bit lines BL1, BL2.

The DRAM shown in FIG. 4 performs read-out and refresh operations which are similar to those performed by the circuitry shown in FIG. 2, except for equalization. The equalizing operation performed when resetting the DRAM in FIG. 4 has an order different from that of the corresponding operation for the DRAM shown in FIG. 2. That is, for equalization of the potentials on the bit lines BL1, BL2 and the nodes N21, N22, of the circuit shown in FIG. 4, first the level of the equalization signal EQ2 is shifted to Vcc, so that all of NMOS transistors 51, 52, 53 of the equalizing circuit 50 are turned on. As a result, the potential on the bit lines BL1, BL2 is shifted to $\frac{1}{2}$·Vcc, through the NMOS transistors 51,52, 53. Then, the potential on the nodes N21, N22 is shifted to the $\frac{1}{2}$·Vcc level, through the NMOS transistors 21,22.

However, the above-described DRAM's have encountered the following problems:

(i) Since the NMOS transistors 21,22, which are controlled by the transfer signal TG, are provided between the bit line BL1 and the node N21, and between the bit line BL2 and the node 22, respectively, a delay occurs in equalizing the potentials of all of the bit lines BL1, BL2 and the nodes N21, N22, to $\frac{1}{2}$·Vcc;

(ii) The transfer signal TG requires a potential higher than Vcc+Vth for refreshing the memory cells 11, 12. This potential is higher than the external source potential Vcc, and accordingly, can be obtained through bootstrap operation by capacitance feed-back. However, the level of the thus obtained transfer signal TG floats, so that if the level is lowered unintentionally, as by a short-circuit or leakage due to a defect produced during manufacture of the DRAM, the equalizing operation for the nodes N21, N22 would be insufficient, resulting in erroneous operation of the DRAM.

SUMMARY OF THE INVENTION

An object of the invention is to provide a DRAM which avoids the problems inherent to the above-described prior art, that is, the problem of a delay in equalizing operations and the problem of erroneous operation of the DRAM, caused by a lowering of the potential level of the transfer signal TG.

Therefore, according to a first aspect of the invention, there is provided a dynamic random access memory of a complementary MOS transistor type, including a pair of first and second word lines provided, respectively, for selecting a first memory cell and a second memory cell, and a first pair of first and second complementary bit lines crossing the word lines. The first and second memory cells are connected, respectively, to cross-over portions of the first bit line and the first word line, and to cross-over portions of the second bit line and the second word line. A sense amplifier circuit includes first and second sense amplifiers which sense and amplify differences between the potentials on a first and a second node. The first sense amplifier comprises n-channel MOSFET transistors and senses and amplifies a difference between a first potential on the first node and a second potential on the second node, when the first potential exceeds the second potential. The second sense amplifier senses and amplifies a difference between the first potential and the second potential, when the first potential exceeds the second potential. A first pair of first and second transfer gates connect, respectively, the first bit line to the first node and the second bit line to the second node.

A sense amplifier equalizing means is activated by a first equalization signal to set the potentials on the first and second nodes equal to each other. A first bit lines equalizing means is activated by a second equalization signal to set the potentials on the first and second bit lines equal to each other. Thus, the potentials on the bit lines are equalized independently of equalization of the potentials on the nodes. Accordingly, there is no delay in the equalization due to the transfer signal controlled gates connecting the nodes to the bit lines. Therefore, it is possible to speed up the equalizing operation, so that so as to enhance the access speed.

According to a second aspect of the invention, at least one further pair of dynamic memory cells, further associated pairs of word lines and bit lines, and at least one further associated bit lines equalizing means, are also provided in the above-described circuit. Further transfer gates connect the further bit lines to the same first and second nodes to which the first pair of transfer gates connects the first pair of bit lines, so that the sense amplifier circuit may be shared by more than one pair of memory cells.

According to a third aspect of the invention, each of the transfer gates of the above described circuits comprises an N-type MOS transistor.

According to a fourth aspect of the invention, there is provided a dynamic random access memory of a complementary MOS transistor type, including a pair of first and second word lines, provided, respectively, for selecting a first memory cell and a second memory cell, and a first pair of first and second complementary bit lines crossing the word lines. The first and second memory cells are connected, respectively, to cross-over portions of the first bit line and the first word line, and to cross-over portions of the second bit line and the second word line. A sense amplifier circuit includes first and second sense amplifiers which sense and amplify differences between the potentials on a first and a second node. The first sense amplifier comprises n-channel MOSFET transistors and senses and amplifies a difference between a first potential on the first node and a second potential on the second node when the first potential exceeds the second potential. The second sense amplifier senses and amplifies a difference between the first potential and the second potential when the first potential exceeds the second potential. A sense amplifier equalizing means is activated by a first equalization signal to set the potentials on the first and second nodes equal to each other.

A first pair of first and second transfer gates is provided respectively for connecting the first bit line to the first node and the second bit line to the second node. Each of the first and second transfer gates comprises a pair of MOSFET transistors connected to each other in parallel, wherein each pair of MOSFET transistors consists of a n-channel MOSFET transistor and a p-channel MOSFET transistor. By, for example, connecting the gate electrode of the NMOS transistor of each transfer gate to the power source (power source potential Vcc) and connecting the gate of each such PMOS transistor to ground (the grounded side of the power source), it is possible to prevent erroneous operation of the DRAM as would otherwise be caused by a drop in the gate potential if each transfer gate were composed of a single MOS transistor.

According to the fifth aspect of the invention, a circuit according to the fourth aspect of the invention further includes a sense amplifier equalizing means which to activated by a first equalization signal to set the potentials on the first and second nodes equal to each other. The circuit further includes a bit lines equalizing means which is actuated by a second equalization signal to set the potentials on the first and second bit lines equal to each other. Thus, the potentials on the bit lines are equalized independently of equalization of the potentials on the nodes. Accordingly, there is no delay in the equalization while transfer signal controlled gates connect the nodes to the bit lines.

According to a sixth aspect of the invention, the circuit according to the fourth aspect of the invention also includes at least one further pair of dynamic memory cells, further associated pairs of word lines and bit lines, and at least one further associated bit lines equalizing means. Further transfer gates, consisting of pairs of p-channel and n-channel MOSFET transistors, connect the further bit lines to the same first and second nodes to which the first pair of transfer gates connects the first pair of bit lines. Therefore, the sense amplifier circuit may be shared by more than one pair of memory cells.

According to a seventh aspect of the invention, the circuit according to the sixth aspect of the invention further includes a sense amplifier equalizing means which is activated by an equalization signal to set the potentials on the first and second nodes equal to each other. The circuit further includes respective bit lines equalizing means which are separately actuated by respective equalization signals to set the potentials on the respective pairs of bit lines equal to each other. Thus, the potentials on the bit lines are equalized independently of equalization of the potentials on the nodes. Accordingly, there is no delay in the equalization while transfer signal controlled gates connect the nodes to the bit lines.

BRIEF DESCRIPTION OF THE DRAWINGS

These and other features and advantages of the invention will be more clearly understood from the following detailed description of the preferred embodiments with reference to the accompanying drawings in which:

FIG. 1B is a waveform diagram showing the operation of the circuitry illustrated in FIG. 1A;

DETAILED DESCRIPTION OF THE PREFERRED EMBODIMENTS

First Embodiment

Figure 1A:
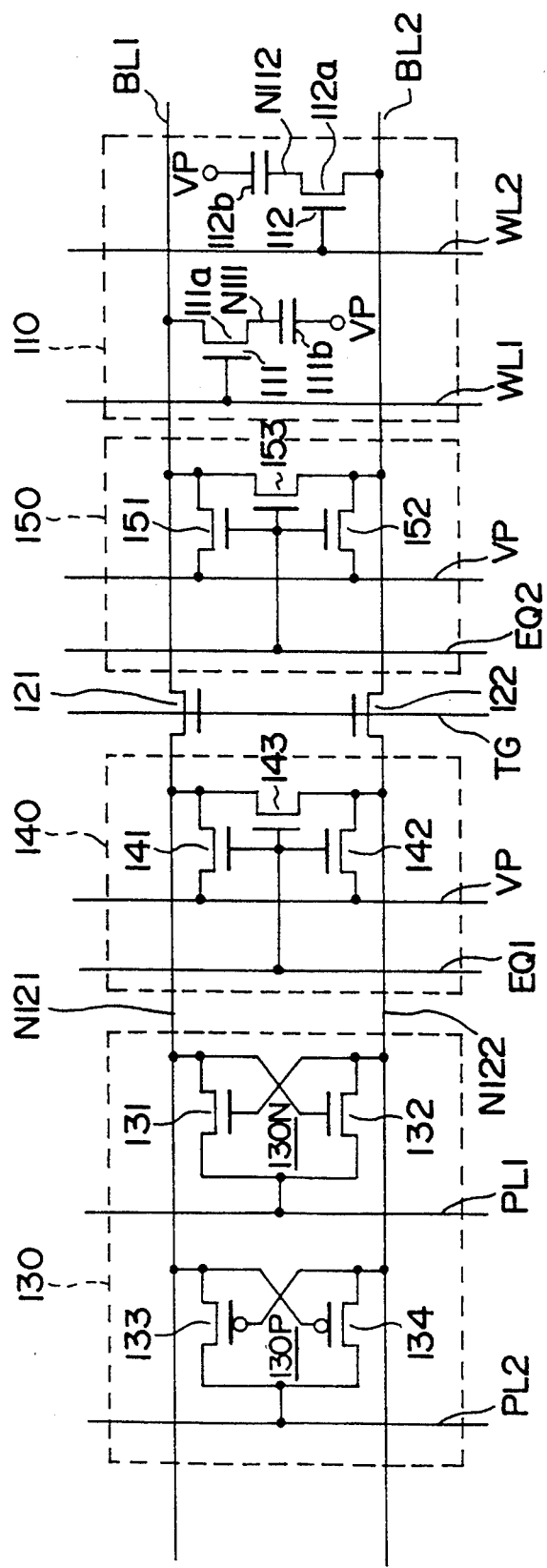
FIG. 1A is a circuit diagram illustrating memory cells and a sense amplifier circuit in a DRAM according to a first embodiment of the invention.

FIG. 1A is a circuit diagram illustrating memory cells and a sense amplifier circuit of a DRAM according to a first embodiment of the invention.

The DRAM of FIG. 1A employs CMOS technology as does the conventional circuitry, and includes multiple pairs of complementary bit lines BL1, BL2 and word lines WL1, WL2, to which memory cells 110 are connected. The memory cells 110 are depicted in FIG. 1A as dynamic memory cells 111, 112 corresponding to two memory bits.

Each of the memory cells 111, 112 is composed of a charge transfer n-channel (N-type) enhancement mode MOSFET transistor (hereinafter "NMOS transistor"), identified respectively by reference numerals 111a, 112a, and a respective charge accumulation capacitance 111b, 112b. Each of the NMOS transistors has a drain and a gate which are connected, respectively, to the bit lines BL1, BL2 and the word lines WL1, WL2. The capacitors 111b, 112b are connected, respectively, between the sources of the NMOS transistors 111a, 112a and a line carrying an internally generated equalizing potential VP.

The bit lines BL1, BL2 are connected, respectively, to the first and second nodes N121, N122, through first and second transfer gates such as NMOS transistors 121, 122, which are turned on and off under the control of a transfer signal TG. A sense amplifier circuit 130 and a sense amplifier equalizing circuit 140 are connected between the first and second nodes N121, N122, which nodes may be considered to be common to the equalizing circuit 140.

The sense amplifier circuit 130 includes a N-type sense amplifier 130N which, when activated by a first active signal PL1, detects and amplifies a potential difference existing between the first and second nodes N121, N122, when the potential on the node N121 exceeds the potential on node N122. Sense amplifier circuit 130 also includes a P-type sense amplifier 130P which, when activated by a second active signal PL2, detects and amplifies a potential difference existing between the nodes, when the potential on the node N122 exceeds the potential on node N121.

The N-type sense amplifier 130N comprises two NMOS transistors 131, 132. The sources of NMOS transistors 1 31, 132 are both connected to the first active signal PL1, while the drains and gates of NMOS transistors 131,132 are cross-connected between the first and second nodes N121, N122. Similarly, the P-type sense amplifier 130P comprises two p-channel (P-type) enhancement mode MOSFET transistors (hereinafter "PMOS transistors"), identified respectively by reference numerals 133, 134. The sources of PMOS transistors 133, 134 are both connected to the second active signal PL2, while the drains and gates of PMOS transistors 133, 134 are cross-connected between the first and second nodes N121, N122.

The sense amplifier equalizing circuit 140, when activated by a first equalization signal EQ1, sets the potential on the first and second nodes N121, N122 to an equalizing potential VP. The equalizing circuit 140 is composed of NMOS transistors 141, 142, 143, all of which are gate-controlled by the first equalization signal EQ1. The drains of the NMOS transistors 141, 142 are connected, respectively, to the first and second nodes N121, N122. The drain and source of the NMOS transistor 143 are also respectively connected to the nodes N121 and N122.

Further, a bit line equalizing circuit 150 is connected between the bit lines BL1, BL2. The bit line equalizing circuit 150, when activated by a second equalization signal EQ2, sets the potential on the first and second bit lines BL1, BL2 to the equalizing potential VP. The equalizing circuit 150 is composed of NMOS transistors 151, 152, 153, all of which are gate-controlled by the second equalization signal EQ2. The sources of the NMOS transistors 151, 152 are connected in common to the equalizing potential. The drains of the NMOS transistors 151, 152 are connected, respectively, to the first and second bit lines BL1, BL2. The drain and source of the NMOS transistor 153 are also respectively connected to the bit lines BL1 and BL2.

The operation of the circuitry shown in FIG. 1A will, with reference to the waveform diagram in FIG. 1B.

The equalizing potential VP is an internally generated voltage level of $\frac{1}{2}$.Vcc, where Vcc is an external power source potential. As shown in FIG. 1B, the transfer signal TG has a voltage level higher than Vcc+Vth, where Vth is the gate threshold level of NMOS transistors 121 and 122. Therefore, these transfer gates 1 21 and 122 are conducting.

Figure 2:
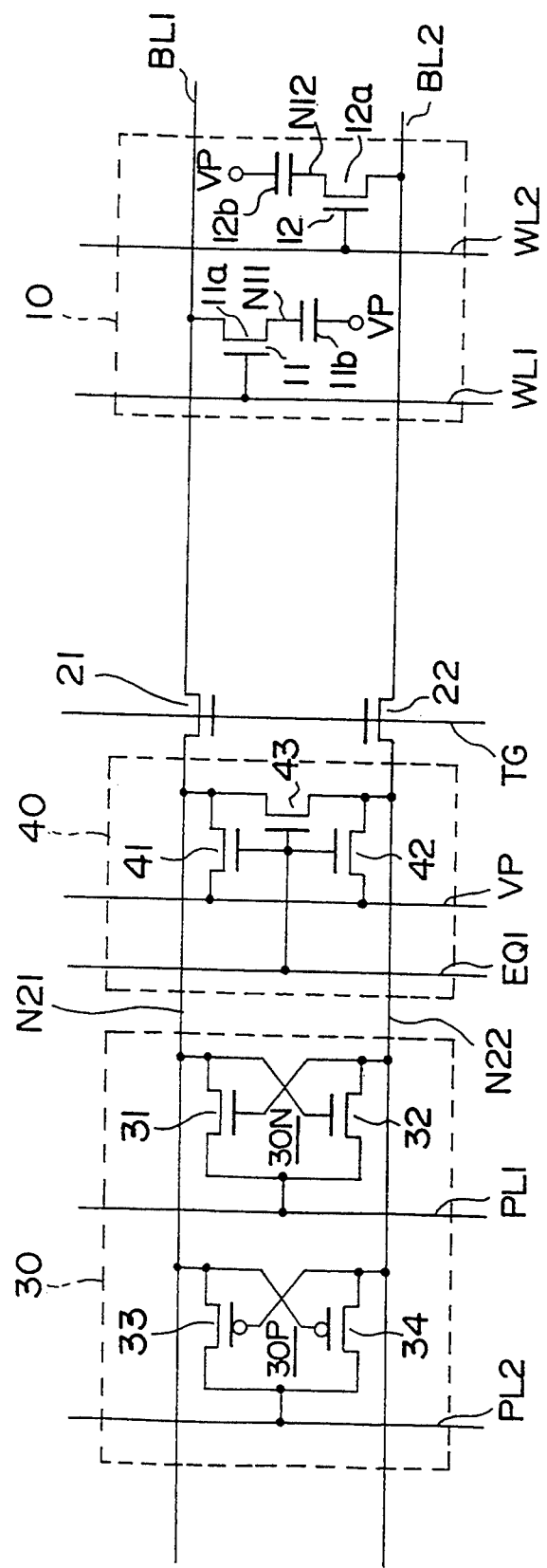
FIG. 2 is a circuit diagram illustrating memory cells and a sense amplifier circuit in a conventional DRAM.
Figure 3:
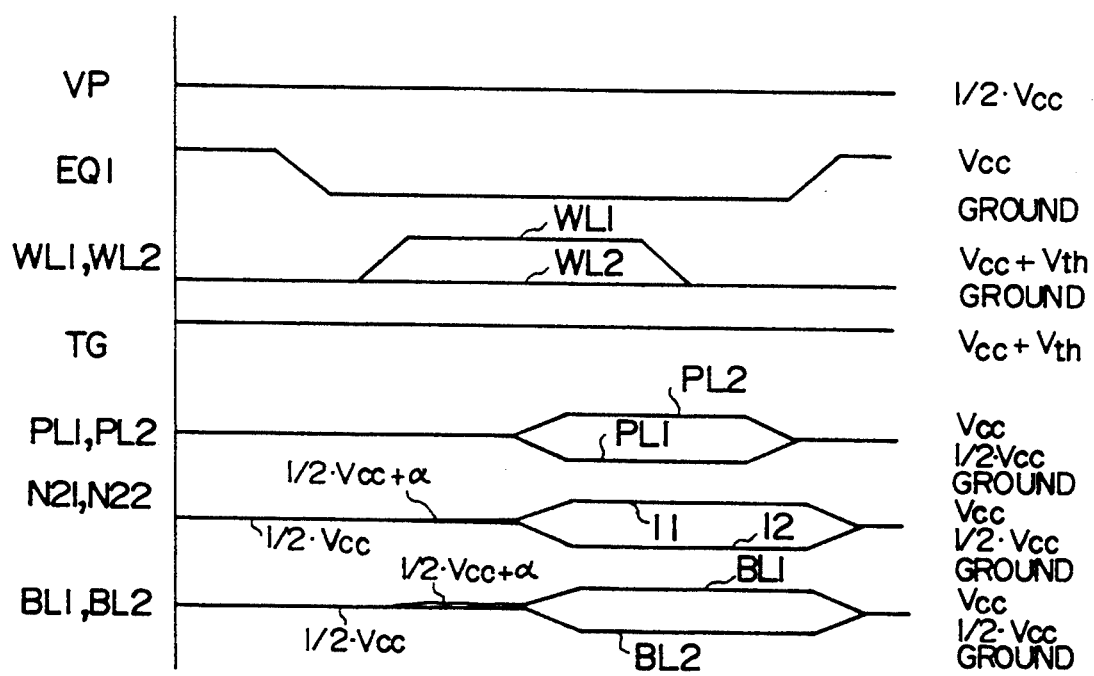
FIG. 3 is a waveform diagram showing the operation of the circuitry illustrated in FIG. 2.
Figure 4:
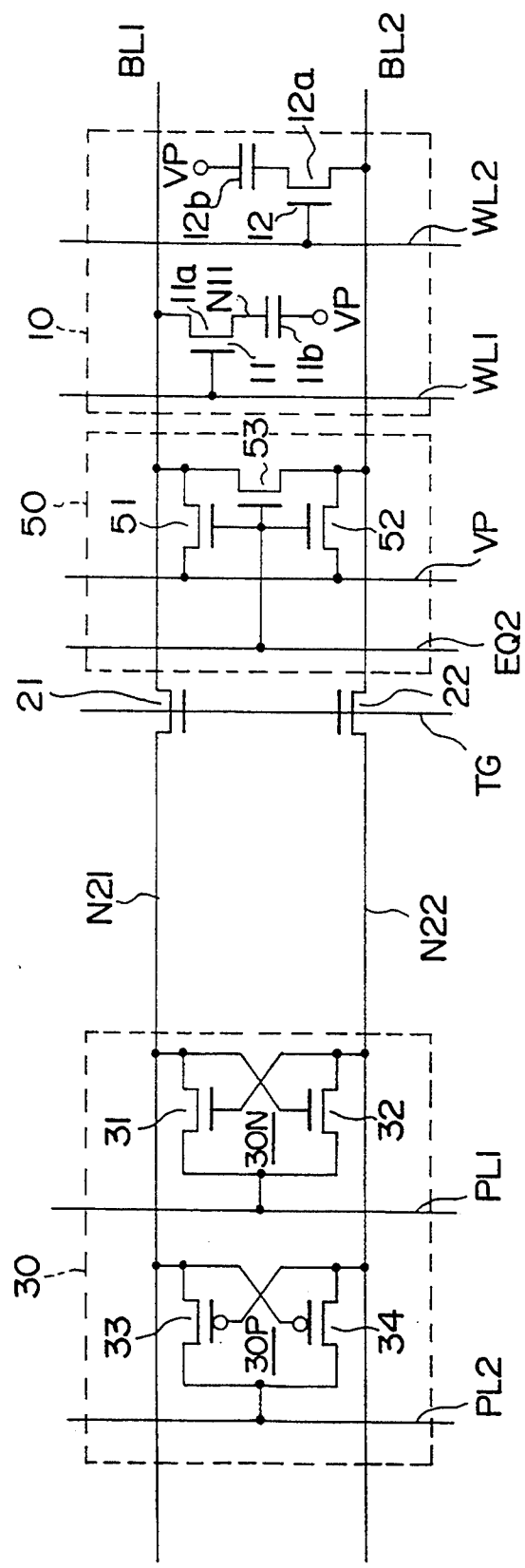
FIG. 4 is a circuit diagram illustrating memory cells and a sense amplifier circuit in another conventional DRAM.

The equalizing operation, when resetting the DRAM, is different from those for the conventional DRAM's illustrated in FIGS. 2 and 4. Briefly stated, the levels of the first and second equalization signals EQ1, EQ2 are simultaneously shifted to Vcc, so that NMOS transistors 141, 142, 143, and 151, 152, 153, respectively of the equalizing circuits 140, 150, all are turned on. The potential on the nodes N121, N122, and the potential on the bit lines BL1, BL2, then are shifted to the level of the equalizing potential VP, $\frac{1}{2}$.Vcc, independently of each other, through the NMOS transistors 141, 142 and NMOS transistors 151, 152, respectively.

Accordingly, the delays in the equalizing operation of the conventional DRAM's illustrated in FIGS. 2 and 4 can be avoided by the invention. That is, the delay in shifting the potential on the bit lines BL1, BL2 to $\frac{1}{2}$.Vcc by way of NMOS transistors 21, 22, when resetting the conventional DRAM shown in FIG. 2, can be eliminated; and the delay in shifting the potential on the nodes N21, N22 to $\frac{1}{2}$.Vcc by way of NMOS transistors 21, 22 when resetting the conventional DRAM shown in FIG. 4, also can be eliminated.

The read-out and refresh operations for the memory cell 111, when it holds a data value, for example, a logic level "1" (corresponding to when the potential on the node N111 is at level of Vcc), will now be described.

For the read-out operation, the levels of the equalization signals EQ1, EQ2 are shifted to the ground level, similarly to the conventional arrangement. Accordingly, NMOS transistors 141, 142, 143, and 151, 152, 153, respectively in the equalizing circuits 140 and 150, are all turned off. A row decoder (not shown) shifts the potential on the word line WL1 from the ground level to a level higher than Vcc+Vth, thus connecting the node N111 to the bit line BL1, through the NMOS transistor 111a of the memory cell 111. In response, charge redistribution occurs, based on the capacitance 111b and the capacitance of the bit line BL1. As a result, the potential on the bit line BL1 rises from $\frac{1}{2}$.Vcc to $\frac{1}{2}$.Vcc+α. The potential level on the bit line BL2 remains at $\frac{1}{2}$.Vcc. Accordingly, the potential on the node N121 is shifted to $\frac{1}{2}$.Vcc+α, through the conducting transfer gate NMOS transistor 121, while the potential on node N122 remains at the $\frac{1}{2}$.Vcc level.

Then, the level of the first active signal PL1 is shifted from the $\frac{1}{2}$.Vcc level to the ground level, while the level of the second active signal PL2 is shifted from $\frac{1}{2}$.Vcc to Vcc, so as to activate the sense amplifier circuit 130. When the sense amplifier circuit 130 is activated, the potential on the node N121 is shifted from the $\frac{1}{2}$.Vcc level to the Vcc level, and the potential on the node N122 is shifted from the $\frac{1}{2}$.Vcc level to the ground level. As a result, the potential on the bit line BL1 is shifted from the $\frac{1}{2}$.Vcc+α level to the Vcc level, through the NMOS transistor 121, and the potential on the bit line BL2 is shifted from $\frac{1}{2}$.Vcc to the ground level, through the NMOS transistor 122.

Throughout this operation, the transfer signal TG is maintained at a level higher than Vcc+Vth, so that NMOS transistors 121 and 122 conduct, and the potential on the bit lines BL1 and BL2 can be shifted to Vcc and ground, respectively. Moreover, the NMOS transistors 121, 122 serve as resistances which isolate the capacitances of the bit lines BL1, BL2 from the sense amplifier circuit 130. Accordingly, it is possible to speed up the sensing and amplifying operations of the sense amplifier circuit 130.

Thereafter, by an output from a column decoder (not shown), the nodes N121, N122 or the bit lines BL1, BL2 are connected through transfer gates (not shown) to a pair of data busses (not shown), and the stored data is transferred to an output buffer (not shown) and is then outputted externally to complete the read-out operation. Further, since the potential on the word line WL1 is set to a level higher than Vcc+Vth, NMOS transistor 111 a of the memory cell 111 is turned on (conductive). As a result, the potential on the node N111 returns to the Vcc level (the level on the bit line BL1), thus completing the refresh operation.

The DRAM is reset to the above-described reset condition through the following procedure. First, the potential on the word line WL1 is shifted from the level higher than Vcc+Vth to the ground level, thereby turning off the NMOS transistor 111a, so as to block access to the data stored in the memory cell 111. After the levels of the first and second active signals PL1, PL2 are shifted to ½.Vcc, the levels of the first and second equalization signals EQ1, EQ2 are shifted to the Vcc level. This causes the potential on the nodes N121, N122 to be shifted to the ½.Vcc level, through the NMOS transistors 141, 142 of the equalizing circuit 140, and the potential on the bit lines BL1, BL2 to also be shifted to the ½.Vcc level, through the NMOS transistors 151, 152 of the equalizing circuit 150, thus completing the resetting operation.

During the read-out and refresh operations, when the memory cell 111 holds a data value of logic level "0" (corresponding to when the potential on the node N111 is at the ground level), the potential on the node N121 and the potential on the bit line BL1 are shifted to the ground level, while the potential on the node N122 and the potential on the bit line BL2 are shifted to the Vcc level. The read-out and the refresh operations for the data are therefore carried out by procedures substantially similar to those above-described for the data value of logic level "1".

This first embodiment offers the following advantages:

Since the sense amplifier equalizing circuit 140 and the bit line equalizing circuit 150 function independently of each other, the equalizing operation occurs independently for the nodes N121, N122 and the bit lines BL1, BL2, without the need to pass a voltage level through NMOS transistors 121, 122. Accordingly, the equalizing operation can be speed up, with the effect that it is possible to shorten the precharge width tPR of a row address strobe signal (RAS), so as to enhance the access speed.

Second Embodiment

Figure 5:
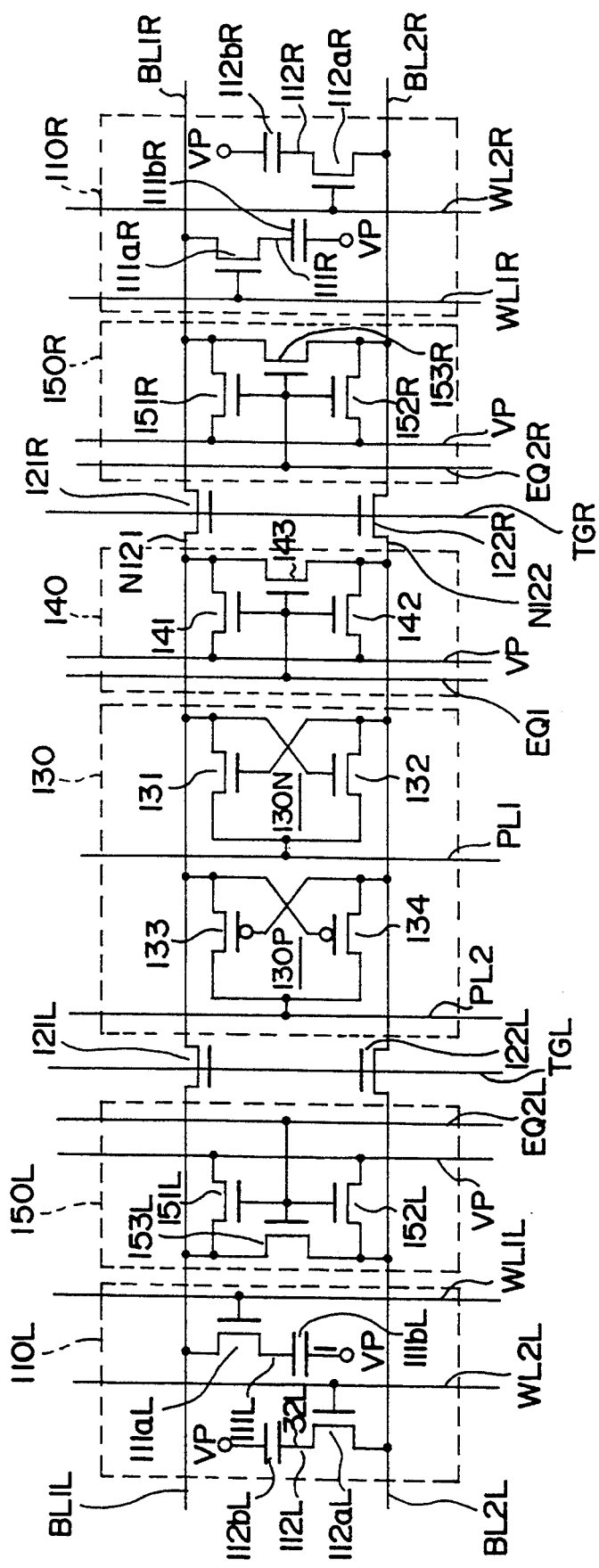
FIG. 5 is a circuit diagram illustrating memory cells and a sense amplifier circuit in a DRAM according to a second embodiment of the invention.

FIG. 5 is a circuit diagram illustrating memory cells and a sense amplifier circuit of a DRAM according to a second embodiment of the invention. In FIG. 5, reference numerals common to those in FIG. 1A designate the same or corresponding elements.

The DRAM of FIG. 5, like that of FIG. 1A, is composed of CMOS transistors, and provides the advantages of the circuit shown in FIG. 1A in a DRAM having a shared sense amplifier circuit (a sense amplifier circuit which is shared by a plurality of pairs of memory cells and bit lines). In brief, the sense amplifier circuit 130 is arranged to be shared by providing, in addition to the elements shown in FIG. 1A, a further bit line equalizing circuit, a further pair of bit lines and further memory cells, connected on the left side of the first and second nodes N121, N122, through a second pair of transfer gates. This embodiment permits a reduction in the overall circuit size, by reducing the number of sense amplifier circuits 130, and thereby provides an enhanced degree of circuit integration.

In more detail, referring to FIG. 5, a sense amplifier equalizing circuit 140 and a bit line equalizing circuit 150R, similar to those shown in FIG. 1A, are connected between the nodes N121, N122. A pair of complementary bit lines BL1R, BL2R are connected to the right side of the nodes N121, N122, through a first pair of transfer gates, such as NMOS transistors 121R, 122R, which are turned on and off under the control of a transfer signal TGR. A further pair of complementary bit lines BL1L, BL2L are connected to the left side of the nodes N121, N122, through a second pair of transfer gates, such as NMOS transistors 121L, 122L, which are turned on and off under the control of a transfer signal TGL.

Memory cells 11 OR and the bit line equalizing circuit 150R, connected to the right side bit lines BL1R, BL2R, are similar to the memory cells and bit line equalizing circuit shown in FIG. 1A. Memory cells 110R are depicted as dynamic memory cells 111R and 112R, corresponding to two memory bits of the memory cells 110R. Each of the memory cells 111R, 112R is composed of a respective NMOS transistor 111aR, 112aR, and a respective charge accumulation capacitance 111bR, 112bR. Each of the NMOS transistors has a drain and a gate which are connected, respectively, to the bit lines BL1R, BL2R and the crossing word lines WL1R, WL2R. The capacitors 111bR, 112bR are connected, respectively, between the sources of the NMOS transistors 111aR, 112a R and a line carrying an internally generated equalizing potential VP. The bit line equalizing circuit 150R is composed of NMOS transistors 151R, 152R, 153R. The equalizing circuit 150R, when activated by an equalization signal EQ2R, sets the potential on the bit lines BL1R, BL2R to the equalizing potential VP.

Memory cells 110L and a bit line equalizing circuit 150L, connected to the left side bit lines BL1L, BL2L, are similar to the memory cells and bit line equalizing circuit on the right side. Thus, memory cells 110L are depicted as dynamic memory cells 111L and 112L, corresponding to two memory bits of the memory cells 110L. Each of the memory cells 111L, 112L is composed of a respective NMOS transistor 111aL, 112a L, and a respective charge accumulation capacitance 111bL, 112bL. Each of the NMOS transistors has a drain and a gate which are connected, respectively, to the bit lines BL1L, BL2L and the crossing word lines WL1L, WL2L. The capacitors 111bL, 112bL are connected, respectively, between the sources of the NMOS transistors 111aL, 112a L and a line carrying an internally generated equalizing potential VP. The bit line equalizing circuit 150L is composed of NMOS transistors 151L, 152L, 153L. The bit line equalizing circuit 150L, when activated by an equalization signal EQ2L, sets the potential on the bit lines BL1L, BL2L to the equalizing potential VP.

Figure 6:
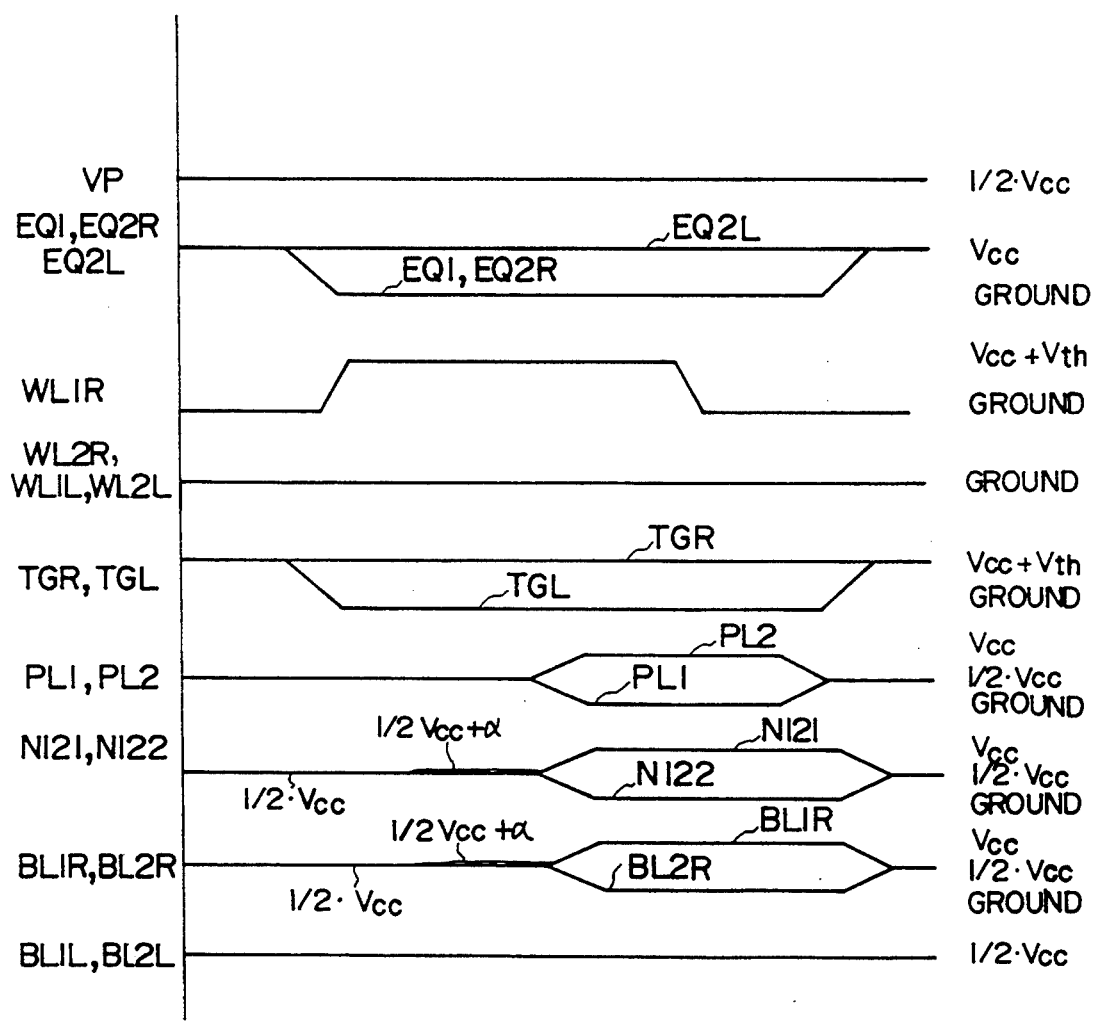
FIG. 6 is a waveform diagram showing the operation of the circuitry illustrated in FIG. 5.

The operation will next be given of operations of the circuitry shown in FIG. 5, will now be described with reference to the waveform diagram shown in FIG. 6.

To reset the DRAM, the transfer signals TGR, TGL are set to a level higher than Vcc+Vth, and the levels of the equalization signals EQ1, EQ2R, EQ2L are set to Vcc. Also, the potentials on the word lines WL1R, WL2R, WL1L, WL2L all are set to the ground level, and the levels of the first and second active signals PL1, PL2 are set to $\frac{1}{2}$.Vcc. As a result, the nodes N121, N122 are connected to the equalizing potential VP ($=\frac{1}{2}$.Vcc), through the NMOS transistors 141, 142 of the equalizing circuit 140. Further, the bit lines BL1R, BL2R are connected to the equalizing potential VP, through the NMOS transistors 151R, 152R of the equalizing circuit 150R. Similarly, the bit lines BL1L, BL2L are connected to the equalizing potential VP, through the NMOS transistors 151L, 152L of the equalizing circuit 150L.

The operation will be further described in the case of selecting, for example, the right side memory cells 110R. At first, the levels of the equalization signals EQ1, EQ2R are shifted to the ground level, while the equalization signal EQ2L is maintained at the Vcc level. As a result, NMOS transistors 141, 142, 143, 151 R, 152R, 153R of the equalizing circuits 140, 150R all are turned off, but NMOS transistors 151L, 152L, 153L of the equalizing circuit 150L remain on, so that the equalizing operation is continued on the left side. Further, the level of the transfer signal TGL is shifted to the ground level, while the level of the transfer signal TGR is maintained higher than Vcc+Vth. As a result, NMOS transistors 121L, 122L are turned off, so that the left side memory cells 110L are not selected, while NMOS transistors 121R, 122R are turned on, so that the right side memory cells 110R are selected.

The read-out and refresh operations for the memory cell 111R when the memory cell 111R holds a data value, for example, of logic level "1", will now be described.

A row decoder (not shown) shifts the potential on the word line WL1R from the ground level to a level higher than Vcc+Vth, so that NMOS transistor 111aR conducts. This allows charge redistribution to occur through the NMOS transistor 111aR, based on the capacitance 111bR and the capacitance of the bit line BL1R. As a result, the potential on the bit line BL1R rises from $\frac{1}{2}$.Vcc to $\frac{1}{2}$.Vcc+$\alpha$. The potential level of the bit line BL2R remains at $\frac{1}{2}$.Vcc. Accordingly, the potential on the node N121 is shifted to $\frac{1}{2}$.Vcc+$\alpha$, through the conducting transfer gate NMOS transistor 121R, while the potential on the node N122 remains at $\frac{1}{2}$.Vcc.

Then, the level of the first active signal PL1 is shifted from $\frac{1}{2}$.Vcc to the ground level, while the level of the second active signal PL2 is shifted from $\frac{1}{2}$.Vcc to Vcc, so as to activate the sense amplifier circuit 130. When the sense amplifier circuit 130 is activated, the potential on the node N121 is shifted from $\frac{1}{2}$.Vcc+$\alpha$ to Vcc, while the potential on the node N122 is shifted from $\frac{1}{2}$.Vcc to the ground level. As a result, the potential on the bit line BL1R is shifted from $\frac{1}{2}$.Vcc+$\alpha$ to the Vcc level, through the NMOS transistor 121R, while the potential on the bit line BL2R is shifted from $\frac{1}{2}$.Vcc to the ground level, through the NMOS transistor 122R. Throughout this operation, the transfer signal TGR is maintained at a level higher than Vcc+Vth, so that the NMOS transistors 121R, 122R are turned on, and thus the potentials on the bit lines BL1R, BL2R can be shifted to the Vcc level and ground, respectively.

Thereafter, by an output from a column decoder (not shown), the nodes N121, N122 are connected to a pair of data busses (not shown), through transfer gates (not shown), and the stored data is transferred to an output buffer (not shown) and is then outputted externally to complete the read-out operation. Further, since the potential on the word line WL1R is set to a level higher than Vcc+Vth, NMOS transistor 111aR of the memory cell 111R is turned on. As a result, the potential on the node at the source side of the NMOS transistor 111aR returns to the Vcc level (the potential on the bit line BL1R), thus completing the refresh operation.

To again reset the DRAM to its above-described reset condition, at first the potential on the word line WL1R is shifted from the level higher than Vcc+Vth to the ground level, thereby turning off the NMOS transistor 111aR so as to block access to the data stored in the memory cell 111R. After the levels of the first and second active signals PL1, PL2 are shifted to $\frac{1}{2}$.Vcc, the levels of the equalization signals EQ1, EQ2R are shifted to the Vcc level. This causes the potentials on the nodes N121, N122 to be shifted to the $\frac{1}{2}$.Vcc level, through the NMOS transistors 141, 142 of the equalizing circuit 140, and causes the potential on the bit lines BL1R, BL2R also to be shifted to the $\frac{1}{2}$.Vcc level, through the NMOS transistors 151R, 152R of the equalizing circuit 150R. Further, the transfer signal TGL is shifted to a level higher than Vcc+Vth. The resetting operation is therefore completed.

Accordingly, the delays in the equalizing operation of the conventional DRAM's illustrated in FIGS. 2 and 4 can be eliminated by the second embodiment of the invention substantially in a manner similar to how such delays are eliminated by the first embodiment. That is, the delay in shifting the potential on the bit lines BL1, BL2 to $\frac{1}{2}$.Vcc by way of NMOS transistors 21,22 when resetting the conventional DRAM shown in FIG. 2, can be eliminated; and the delay in shifting the potential on the nodes N21, N22 to $\frac{1}{2}$.Vcc by way of NMOS transistors 21,22, when resetting the conventional DRAM shown in FIG. 4, also can be eliminated.

During the read-out and refresh operations, when the memory cell 111R holds a data value of logic level "0", the potentials on the node N121 and the bit line BL1R are shifted to the ground level, while the potentials on the node N122 and the bit line BL2R are shifted to the Vcc level. The read-out and refresh operations for the data thereafter are carried out by procedures substantially similar to those above-described for the data value of logic level "1". Further, if the left side memory cells 110L are selected, the levels of the equalization signals EQ1, EQ2L are shifted to the ground level, while the second equalization signal EQ2R remains at the Vcc level. Further, the transfer signal TGR is shifted to the ground level, while the transfer signal TGL is held at a higher than Vcc+Vth level. The read-out and refresh operations are then carried out in a manner similar to that described above for the read-out and refresh operations on the right side memory cells 110R.

The second embodiment offers the following advantages:

Since the sense amplifier equalizing circuit 140 for the shared sense amplifier equalizing circuit 130, and the bit line equalizing circuits 150R and 150L, function independently of each other, the equalizing operation occurs independently for the nodes N121, N122 and the bit lines BL1R, BL2R, and BL1L, BL2L. Accordingly, the equalizing operation can be speed up, with the effect that it is possible to shorten the precharge width tPR of a row address strobe signal (RAS), so as to enhance the access speed.

Third Embodiment

Figure 7:
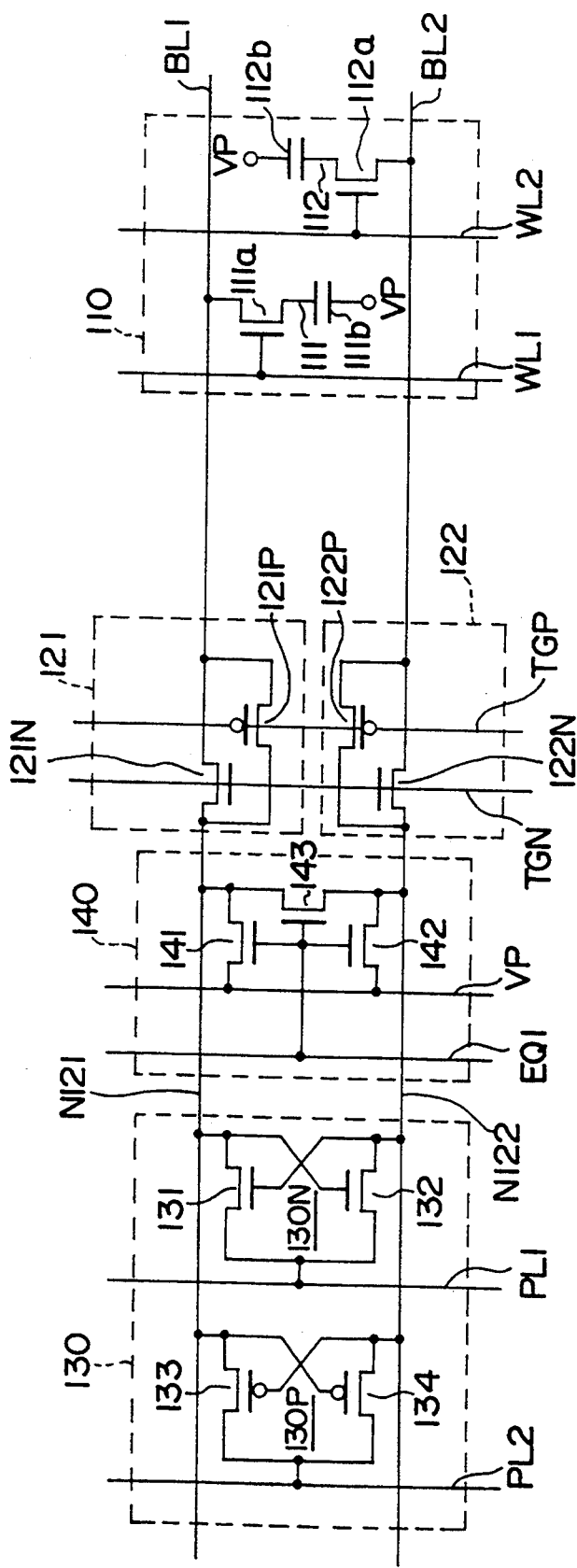
FIG. 7 is a circuit diagram illustrating memory cells and a sense amplifier circuit in a DRAM according to a third embodiment of the invention.

FIG. 7 is a circuit diagram illustrating memory cells and a sense amplifier circuit in a DRAM according to a third embodiment of the invention. In FIG. 7, reference numerals common to those in FIG. 1A designate the same or corresponding elements.

Briefly stated, the DRAM of FIG. 7 differs from the conventional DRAM of FIG. 2 in that (1) a NMOS transistor 121N and a PMOS transistor 121P, connected in parallel, replace a single NMOS transistor 21 as the first transfer gate, and (2) a NMOS transistor 122N and a PMOS transistor 122P, connected in parallel, replace a single NMOS transistor 22 as the second transfer gate. The DRAM of FIG. 7 differs from the embodiment of FIG. 1A in the above respect, and also in that a bit line equalizing circuit is not provided in the embodiment of FIG. 7.

The NMOS transistor 121N and PMOS transistor 121 P, constituting the first transfer gate 121, are connected in parallel between the node 121N and the bit line BL1. Similarly, NMOS transistor 122N and PMOS transistor 122P, constituting the second transfer gate 122, are connected in parallel between the node N122 and the bit line BL2. NMOS transistors 121N, 122N are turned on and off under the control of a transfer signal TGN. Similarly, PMOS transistors 121P, 122P are turned on and off under the control of a transfer signal TGP.

Figure 8:
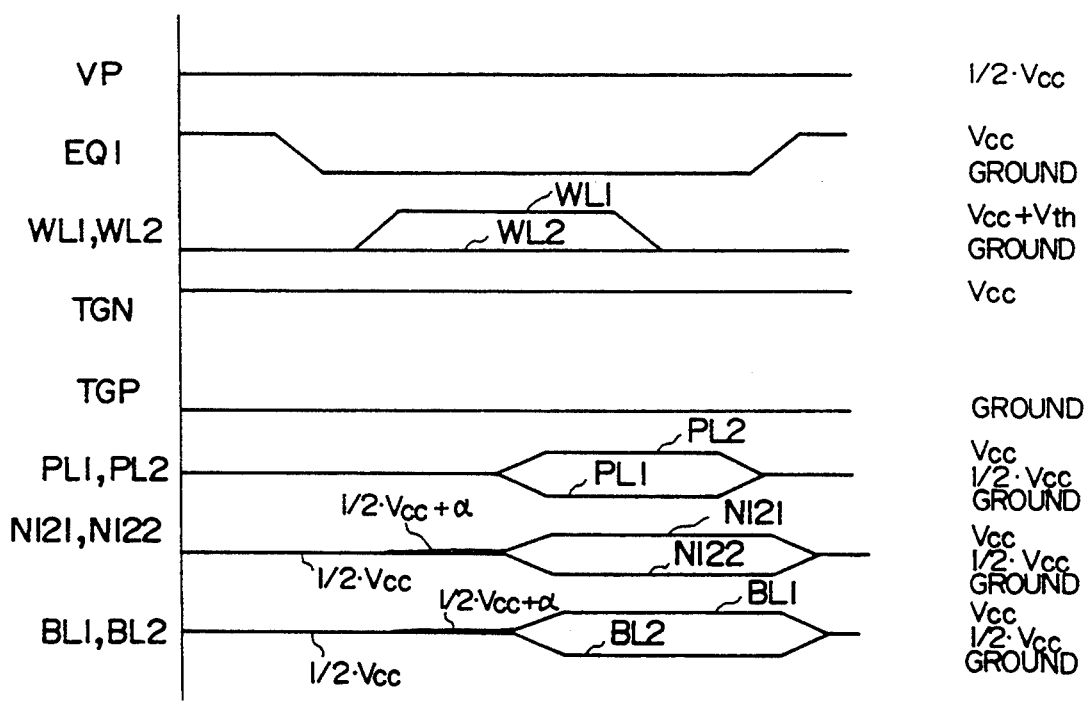
FIG. 8 is a waveform diagram showing the operation of the circuitry illustrated in FIG. 7.

FIG. 8 is a waveform diagram useful for understanding the operation of the circuitry shown in FIG. 7. The circuitry shown in FIG. 7 will now be described with reference to FIG. 8.

The equalizing potential VP is set to a level of ½.Vcc, the level of the transfer signal TGN is set to Vcc, and the level of the transfer signal TGP is set to ground. To reset the DRAM, the level of the equalization signal EQ1 is set to Vcc, the potentials on the word lines WL1, WL2 are set to the ground level, and the levels of the first and second active signals PL1, PL2 are set to ½.Vcc. As a result, the nodes N121, N122 are connected to the equalizing potential VP, through the NMOS transistors 141, 142 of the equalizing circuit 140, respectively, so that the potential on both nodes is set to ½.Vcc. Further, the bit line BL1 is connected to the node N121, through the NMOS transistor 121N and PMOS transistor 121P, and the bit line BL2 is connected to the node N122, through the NMOS transistor 122N and PMOS transistor 122P, so that the potentials on both bit lines also have a level of ½.Vcc.

The read-out and refresh operations for the memory cell 111, when the memory cell 111 holds a data value, for example, of logic level "1", will now be described.

For the read-out operation, the equalization signal EQ1 is shifted to the ground level, so that the equalizing circuit 140 is turned off. The potential on the word line WL1 is shifted from the ground level to a level higher than Vcc+Vth, thus turning on the NMOS transistor 111a. In response, a charge redistribution occurs through the NMOS transistor 111a, based on the capacitance 111b, and the capacitance of the bit line BL1. As a result, the potential of the bit line BL1 rises from ½.Vcc to ½.Vcc+α. The potential on the bit line BL2 remains at a level of ½.Vcc. The potential on the node N121 is accordingly shifted to ½.Vcc+α, through the NMOS transistor 121N and PMOS transistor 121P, while the potential on the node N122 remains at a level of ½.Vcc.

Next, the level of the first active signal PL1 is shifted from a level of ½.Vcc to the ground level, while the level of the second active signal PL2 is shifted from ½.Vcc to Vcc, thereby activating the sense amplifier circuit 130. When the sense amplifier circuit is activated, the potential on the node N121 is shifted from ½.Vcc+α to Vcc, and the potential on the node N122 is shifted from the ½.Vcc level to the ground level. As a result, the potential on the bit line BL1 is shifted from the ½.Vcc+α level to the Vcc level, through the NMOS transistor 121N and PMOS transistor 121P. Similarly, the potential on the bit line BL2 is shifted from ½.Vcc to the ground level, through the NMOS transistor 122N and PMOS transistor 122P. Throughout this operation, PMOS transistors 121P and 122P are turned on, since the transfer signal TGP is set to the ground level, so that the potential on the bit lines BL1 and BL2 can be shifted to the Vcc and ground levels, respectively.

Thereafter, by an output from a column decoder (not shown), the nodes N121, N122, or the bit lines BL1, BL2, are connected to a pair of data busses (not shown) through transfer gates (not shown), and the stored data is transferred to an output buffer (not shown) and is then outputted externally to complete the read-out operation. Further, since the potential on the word line WL1 is set to a level higher than Vcc+Vth, NMOS transistor 111a of the memory cell 111 is turned on. As a result, the potential on the node N111 returns to the Vcc level (the level on the bit line BL1 ), thus completing the refresh operation.

To again reset the DRAM to the above-described reset condition, at first the potential on the word line WL1 is shifted from the level higher than Vcc+Vth to the ground level, thereby turning off NMOS transistor 111a, so as to disconnect the first bit line BL1 from the data stored in the memory cell 111. After the levels of the first and second active signals PL1, PL2 are shifted to ½.Vcc, the level of the equalization signal EQ1 is shifted to the Vcc level, which causes the potential on the nodes N121, N122 to be shifted to the ½.Vcc level, through the conducting NMOS transistors 141, 142 of the equalizing circuit 140. Since the first transfer gate 121 (NMOS transistor 121N and PMOS transistor 121P) and the second transfer gate 122 (NMOS transistor 122N and PMOS transistor 122P) remain conducting, the potential on the bit line BL1 is shifted to the ½.Vcc level, through the NMOS transistor 121N and PMOS transistor 121P, and the potential on the bit line BL2 is shifted to the ½.Vcc level, through the NMOS transistor 122N and PMOS transistor 122P, thereby to complete the resetting operation.

The third embodiment offers the following advantages:

Since each of the transfer gates for connecting the respective nodes N121, N122 to the respective bit lines is formed of a NMOS transistor and a PMOS transistor 121P which are connected in parallel, the gates of the NMOS transistors and PMOS transistors can be connected to the power source (Vcc level and ground level, respectively), so that at least one of each parallel connected pair of transistors assuredly will be on (conducting). By contrast, in the conventional arrangements, such as are shown in FIG. 2 and 4, since the first and second transfer gates consist, respectively, of single NMOS transistors 21, 22, it has been required to set the potentials on the gate electrodes of these NMOS transistors 21,22 to a Vcc+Vth level in order to turn them on and maintain them on. Accordingly, the gates of these NMOS transistors float. Therefore, if the potential level on either of these gates should drop due to leakage caused by a manufacturing defect, the DRAM would operate erroneously. On the contrary, according to the third embodiment, the gates of NMOS transistors 121N, 122N and PMOS transistors 121P, 122P can be connected to the power source, so that it is possible to reliably prevent erroneous operation of the DRAM caused by leakage which may occur at the gates.

Fourth Embodiment

Figure 9:
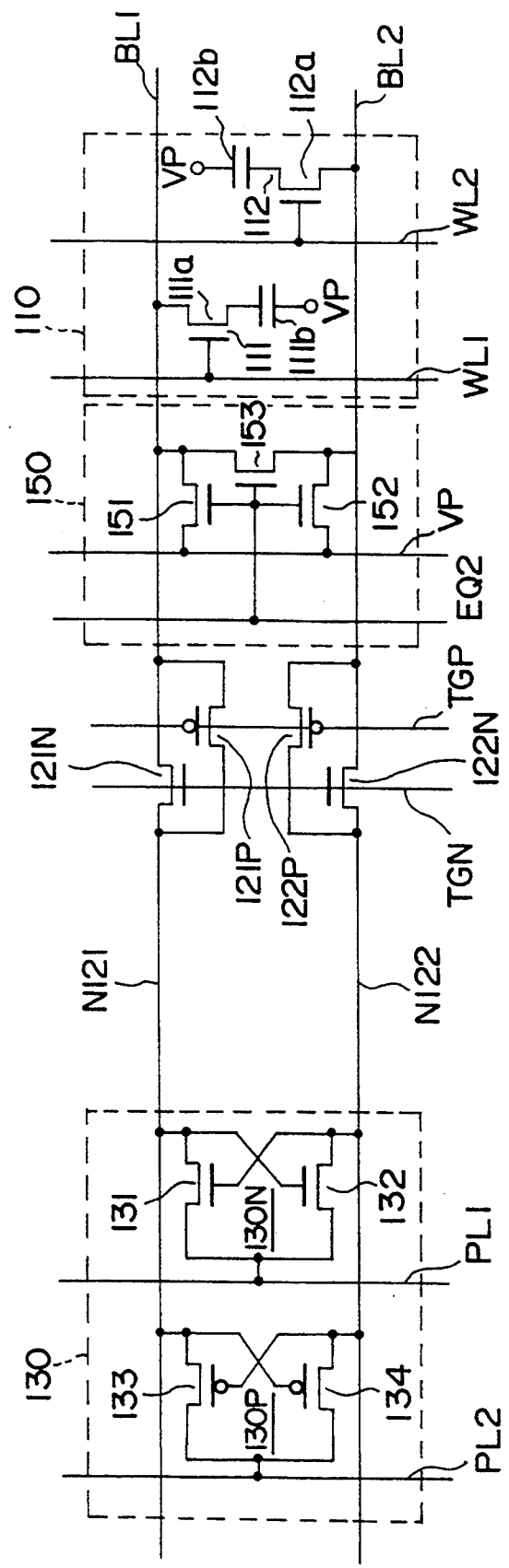
FIG. 9 is a circuit diagram illustrating memory cells and a sense amplifier circuit in a DRAM according to a fourth embodiment of the invention.

FIG. 9 is a circuit diagram illustrating memory cells and a sense amplifier circuit in a DRAM according to a fourth embodiment of the invention. In FIG. 9, reference numerals common to those in FIG. 7 designate the same or corresponding elements.

The DRAM of FIG. 9 differs from that of FIG. 7 in that the sense amplifier equalizing circuit 140 shown in FIG. 7 is eliminated, and a bit line equalizing circuit 150 is connected between the bit lines BL1, BL2. Thus, the embodiment of FIG. 9 differs from that of FIG. 7 in the same way that the conventional circuit of FIG. 4 differs from that of FIG. 2.

The operation of the circuitry shown in FIG. 9 will be described. To reset the DRAM, the level of the equalizing potential VP is set to $\frac{1}{2}$.Vcc, the level of the equalization signal EQ2 is set to Vcc, and the potentials on the word lines WL1, WL2 are set to the ground level. Also, the levels of transfer signals TGN and TGP are set respectively to Vcc and ground, and the levels of the first and second active signals PL1, PL2 are set to $\frac{1}{2}$.Vcc. In response, the bit lines BL1, BL2 are connected to the equalizing potential VP, through the NMOS transistors 151, 152 of the equalizing circuit 150. Further, the node N121 is connected to the bit line BL1, through the NMOS transistor 121N and PMOS transistor 121P, and the node N122 is connected to the bit line BL2, through the NMOS transistor 122N and PMOS transistor 122P. As a result, the potentials on the bit lines BL1, BL2 and the nodes N121 and N122 are all set to the level of the equalizing potential VP (=$\frac{1}{2}$.Vcc).

For the readout and refresh operations on the memory cells 110, the level of the equalization signal EQ2 is shifted to the ground level, similarly to the conventional arrangement, and accordingly, the equalizing circuit 150 is turned off.

The read-out and refresh operations for the memory 111, when it holds a data value, for example, of logic level "1", will now be described. The potential on the word line WL1 is shifted from the ground level to a level higher than Vcc+Vth, thus turning on the NMOS transistor 111a. In response, charge redistribution occurs through the NMOS transistor 111a, based on the capacitance 111b in the memory cell 111, and the capacitance of the bit line BL1. As a result, the potential on the bit line BL1 rises from $\frac{1}{2}$.Vcc to $\frac{1}{2}$.Vcc+$\alpha$. The potential level on the bit line BL2 remains at $\frac{1}{2}$.Vcc. The potential on the node N121 accordingly is shifted to the $\frac{1}{2}$.Vcc+$\alpha$ level, through the NMOS transistor 121N and PMOS transistor 121P, while the potential on the node N122 remains at $\frac{1}{2}$.Vcc.

Next, the sense amplifier circuit 130 is activated by the first and second active signals PL1, PL2, and accordingly, the potential on the node N121 is shifted from $\frac{1}{2}$.Vcc+$\alpha$ to Vcc, while the potential on the node N122 is shifted from $\frac{1}{2}$.Vcc to the ground level. Then, the potential on the bit line BL1 is shifted from $\frac{1}{2}$.Vcc+$\alpha$ to Vcc, through the NMOS transistor 121N and PMOS transistor 121P, while the potential on the bit line BL2 is shifted from $\frac{1}{2}$.Vcc to the ground level, through the NMOS transistor 122N and PMOS transistor 122P. Throughout this operation, PMOS transistors 121P and 122P are turned on (conducting), since the transfer signal TGP is set to the ground level, so that the potentials on the bit lines BL1, BL2 can be shifted to Vcc and ground, respectively.

Thereafter, by an output from a column decoder (not shown), similarly to the operation of the circuitry shown in FIG. 7, the nodes N121, N122 or the bit lines BL1, BL2 are connected to a pair of data busses (not shown), and stored data is outputted externally to complete the read-out operation. Further, since the potential on the word line WL1 is maintained at a level higher than Vcc+Vth, NMOS transistor 111a of the memory cell 111 is turned on. As a result, the source side node of NMOS transistor 111a returns to the Vcc level (the level on the bit line BL1), thus completing the refresh operation.

To again reset the DRAM, the potential on the word line WL1 is shifted from the level higher than Vcc+Vth to the ground level, thereby turning off NMOS transistor 111a, so as to disconnect the first bit line BL1 from the data stored in the memory cell. After the levels of the first and second active signals PL1, PL2 are shifted to $\frac{1}{2}$.Vcc, the level of the equalization signal EQ2 is shifted to the Vcc level, which turns on the equalizing circuit 150, so that the potentials on the bit lines BL1, BL2 are shifted to the $\frac{1}{2}$.Vcc level. Thereafter, the potential on the node N121 is shifted to the $\frac{1}{2}$.Vcc level, through the NMOS transistor 121N and PMOS transistor 121P, while the potential on the node N122 is shifted to the $\frac{1}{2}$.Vcc level, through the NMOS transistor 122N and PMOS transistor 122P, thus completing the resetting operation.

This fourth embodiment offers advantages similar to those of the third embodiment.

Fifth Embodiment

Figure 10:
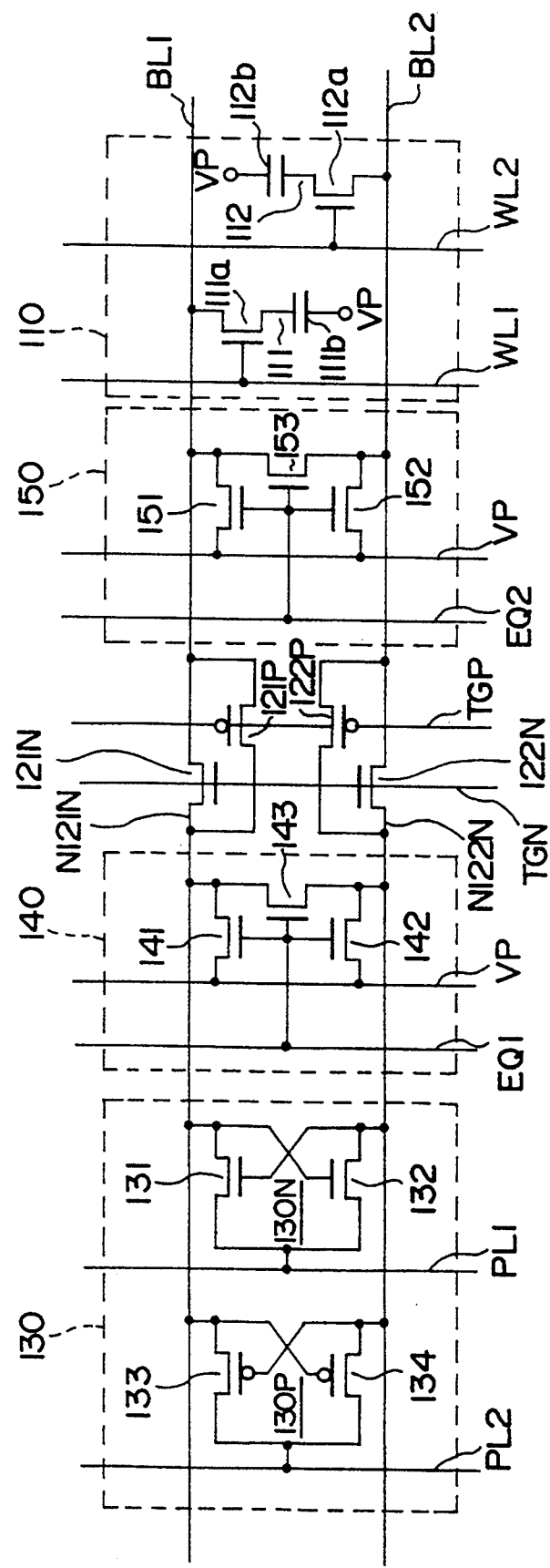
FIG. 10 is a circuit diagram illustrating memory cells and a sense amplifier circuit in a DRAM according to a fifth embodiment of the invention.

FIG. 10 is a circuit diagram illustrating memory cells and a sense amplifier circuit in a DRAM according to a fifth embodiment of the invention. In FIG. 10, reference numerals common to those in FIG. 9 designate the same or corresponding elements.

The DRAM of FIG. 10 differs from the DRAM of FIG. 9 in that both a sense amplifier equalizing circuit 140 and a bit line equalizing circuit 150 are provided, with the circuits 140 and 150 respectively receiving to equalization signals EQ1 and EQ2.

The DRAM of FIG. 10 carries out the read-in and refresh operations similarly to the third embodiment. However, the DRAM of FIG. 10 carries out the equalizing operation, when resetting the DRAM, differently than the third embodiment: In the equalizing operation of the DRAM of FIG. 10, the levels of the equalization signals EQ1, EQ2 are shifted to the Vcc level. In response, the NMOS transistors 141, 142, 143 of the equalizing circuit 140 are turned on, so as to shift the potential level on the nodes N121, N122 to the level of the equalizing potential VP, which is $\frac{1}{2}$.Vcc. Also, independently of the equalizing circuit 140, the NMOS transistors 151, 152, 153 of the equalizing circuit 150 are turned on, so as to shift the potential level on the bit lines BL1, BL2 also to ½.Vcc. Accordingly, delays in shifting the potential on the bit line BL1 to the ½.Vcc level, by way of NMOS transistor 121N and PMOS transistor 121P, and delays in shifting the potential on the bit line BL2 to the ½.Vcc level, by way of NMOS transistor 122N and PMOS transistor 122P (as may occur during the resetting operation of the DRAM shown in FIG. 7), can be eliminated in the DRAM of FIG. 10. Similarly, delays in shifting the potential on the node N121 to ½.Vcc, by way of NMOS transistor 121N and PMOS transistor 121P, and delays in shifting the potential on the node N122 to ½.Vcc, by way of NMOS transistor 122N and PMOS transistor P122 (as may occur during the resetting operation of the DRAM shown in FIG. 9), also can be eliminated in the DRAM of FIG. 10.

Thus, in the fifth embodiment, since there are provided a sense amplifier equalizing circuit 140 and a bit line equalizing circuit 150, which are independent of each other, a delay in the resetting operation of the DRAM can be avoided. Therefore, the advantages provided by the first embodiment can be obtained. Moreover, since, like the third embodiment, each transfer gate is formed by a NMOS transistor and a PMOS transistor connected in parallel, the advantages of the third embodiment are also provided.

Sixth Embodiment

Figure 11:
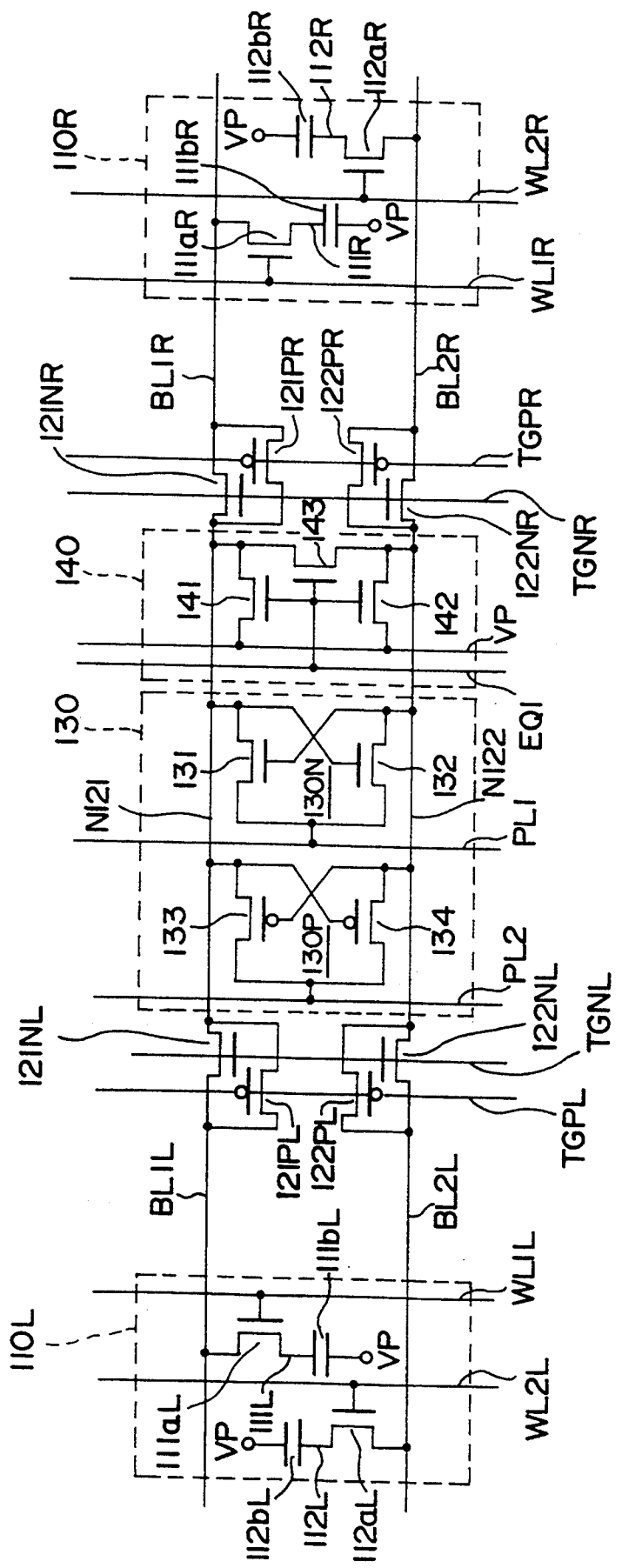
FIG. 11 is a circuit diagram illustrating memory cells and a sense amplifier circuit in a DRAM according to a sixth embodiment of the invention.

FIG. 11 is a circuit diagram illustrating memory cells and a sense amplifier circuit of a DRAM according to a sixth embodiment of the invention. In FIG. 11, reference numerals common to those in FIG. 5 designate the same or corresponding elements.

The DRAM of FIG. 11 has a shared sense amplifier circuit, as in the second embodiment of FIG. 5, but is without the bit line equalizing circuits 150R and 150L of FIG. 5. Also, in the DRAM of FIG. 11, each transfer gate consists of a NMOS transistor and a PMOS transistor connected in parallel, as in the third embodiment of FIG. 7.

NMOS transistor 121NR and PMOS transistor 121PR, constituting the first right transfer gate, are connected in parallel between the node N121 and the bit line BL1R. NMOS transistor 121NL and PMOS transistor 121PL, constituting the first left transfer gate, are connected in parallel between the bit line BL1L and the node N121. Similarly, NMOS transistor 122NR and PMOS transistor 122PR, constituting the second right transfer gate, are connected in parallel between the node N122 and the bit line BL2R. NMOS transistor 122NL and PMOS transistor 122PL, constituting the second left transfer gate, are connected in parallel between the bit line BL2L and the node N122.

NMOS transistors 121NR, 122NR are turned on and off under the control of a transfer signal TGNR. Similarly, PMOS transistors 121PR, 122PR are turned on and off under the control of a transfer signal TGPR, NMOS transistors 121NL, 122NL are turned on under the control of a transfer signal TGNL, and PMOS transistors 121PL, 122PL are turned on and off under the control of a transfer signal TGPL.

Figure 12:
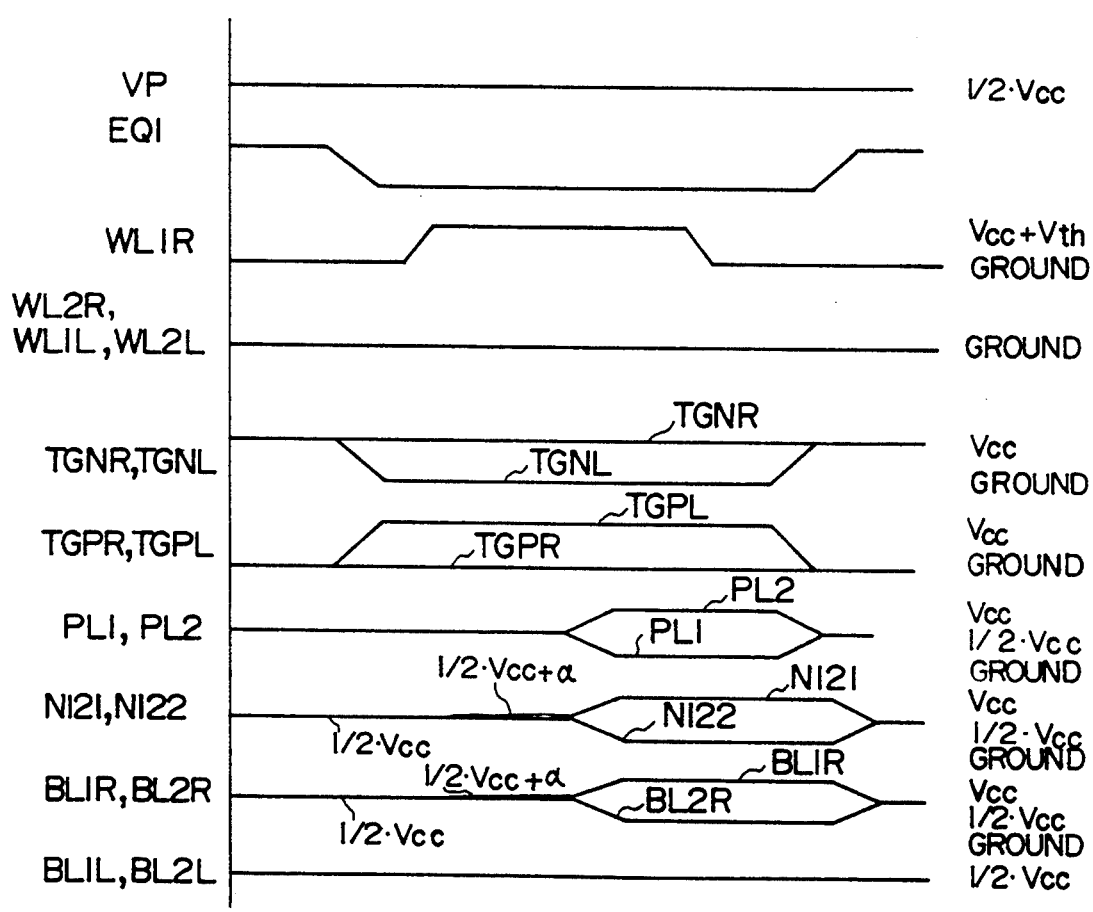
FIG. 12 is a waveform diagram showing the operation of the circuitry illustrated in FIG. 11.

FIG. 12 is a waveform diagram useful for understanding the operation of the circuitry of FIG. 11, which will now be described.

To reset the DRAM, the levels of the transfer signals TGNR, TGNL are set to Vcc, the levels of the transfer signals TGPR, TGPL are set to the ground level, and the level of the equalization signal EQ1 is set to Vcc. Also, the levels of the word lines WL1R, WL2R, WL1L, WL2L all are set to ground, and the levels of the first and second active signals PL1, PL2 are set to ½.Vcc. As a result, the nodes N121, N122 are connected to the equalizing potential VP, through the NMOS transistors 141, 142 of the equalizing circuit 140, so that the potential on both nodes is ½.Vcc. Further, the bit line BL1R is connected to the node N121, through the NMOS transistor 121NR and PMOS transistor 121PR, and the bit line BL2R is connected to the node N122, through the NMOS transistor 122NR and PMOS transistor 122PR, so that the potential on each of the right side bit lines also is ½.Vcc. The bit line BL1L also is connected to the node N121, through the NMOS transistor 121NL and PMOS transistor 121PL, and the bit line BL2L is connected to the node N122, through the NMOS transistor 122NL and PMOS transistor 122PL, so the potential on each of the left side bit lines is set to ½.Vcc, as well.

The read-out and refresh operations will now be described in the case of selecting, for example, the right side memory cells 110R, and wherein, for example, the memory cell 111R stores a data value of logic level "1" (corresponding to when the potential on the node on the source side of the NMOS transistor 111aR is at the Vcc level). At first, the level of the equalization signal EQ1 is shifted to ground, so that the equalizing circuit 140 is turned off. Further, the level of the transfer signal TGNL is shifted to ground, and the level of the transfer signal TGPL is shifted to Vcc, while the transfer signal TGNR is maintained at the Vcc level and the transfer signal TGPR is maintained at the ground level. As a result, NMOS transistors 121NL, 122NL and PMOS transistors 121PL, 122PL are turned off, so that the left side memory cells 110L are not selected. Meanwhile, NMOS transistors 121NR, 122NR and PMOS transistors 121PR, 122PR are turned on, so that the right side memory cells 110R are selected.

The potential on the word line WL1R is next shifted, by a row decoder (not shown), from the ground level to a level higher than Vcc+Vth, thus turning on the NMOS transistor 111aR. Charge redistribution then occurs through the NMOS transistor 111aR, based on the capacitance 111bR in the memory cell 111R, and the capacitance of the bit line BL1R. The potential on the bit line BL1R rises from ½.Vcc to ½.Vcc+α. The potential level on the bit line BL2R remains at ½.Vcc. The potential on the node N121 is then shifted to a level of ½.Vcc+α, through the NMOS transistor 121NR and PMOS transistor 121PR, while the potential on the node N122 remains at ½.Vcc.

Next, the sense amplifier circuit 130 is activated by the first and second active signals PL1, PL2, and accordingly, the potential on the node N121 is shifted from ½.Vcc+α to Vcc, and the potential on the node N122 is shifted from the ½.Vcc level to the ground level. As a result, the potential on the bit line BL1R is shifted from ½.Vcc+α to Vcc, through the NMOS transistor 121NR and PMOS transistor 121PR, and the potential on the bit line BL2R is shifted from the ½.Vcc level to the ground level, through the NMOS transistor 122NR and PMOS transistor 122PR. Throughout this operation, PMOS transistors 121PR, 122PR are turned on, since the transfer signal TGPR is set to the ground level. Accordingly, the potentials on the bit lines BL1R, BL2R can be shifted to the Vcc level and the ground level, respectively.

Thereafter, by an output from a column decoder (not shown), the nodes N121, N122 are connected to a pair of data busses (not shown), and the stored data is transferred to an output buffer (not shown), and is then outputted externally to complete the read-out operation. Further, since the potential on the word line WL1R is set to a level higher than Vcc+Vth, NMOS transistor 111aR of the memory cell 111R is turned on. Accordingly, the potential on the source side node of the NMOS transistor 111aR returns to the Vcc level (the level of the bit line BL1R), thus completing the refresh operation.

To again reset the DRAM, the potential on the word line WL1R is shifted from the level higher than Vcc+Vth, to the ground level, thereby turning off NMOS transistor 111aR, so as to disconnect the first bit line BL1R from the data stored in the memory cell 111R. After the levels of the first and second active signals PL1, PL2 are shifted to the ½.Vcc level, the level of the equalization signal EQ1 is shifted to the Vcc level, so that the potential on the nodes N121, N122 is shifted to the ½.Vcc level. Thereafter, the potential on the bit line BL1R is shifted to the ½.Vcc level, through the NMOS transistor 121NR and PMOS transistor 121PR, while the potential on the bit line BL2R is shifted to the ½.Vcc level, through the NMOS transistor 122NR and PMOS transistor 122PR. Further, the transfer signal TGNL is shifted to the Vcc level, while the transfer signal TGPL is shifted to the ground level, thus completing the resetting operation.

When, during the readout operation, the memory cell 111R holds a data value of logic level "0" (corresponding to when the potential on the source side node of the NMOS transistor 111aR is at the ground level), the potentials on the node N121 and the bit line BL1R are shifted to the ground level, while the potentials on the node N122 and the bit line BL2R are shifted to the Vcc level. The read-out and refresh operations for the data are then completed by procedures substantially similar to those above-described for the data value of logic level "1". Further, if the left side memory cells 110L are selected, the transfer signal TGNR is shifted to the ground level and the transfer signal TGPR is shifted to the Vcc level, while the transfer signal TGNL is held at the Vcc level and the transfer signal TGPL is held at the ground level. The read-out and refresh operations then are carried out in a manner similar to that described above for the right side memory cells 110R.

This sixth embodiment offers the following advantages:

Since the transfer gates for connecting the bit lines BL1R and BL2R, and the bit lines BL1L and BL2L to the shared sense amplifier 130 are composed of NMOS transistors and PMOS transistors which are connected in parallel, advantages similar to those provided by the third embodiment can be obtained by this embodiment as well.

Seventh Embodiment

Figure 13A:
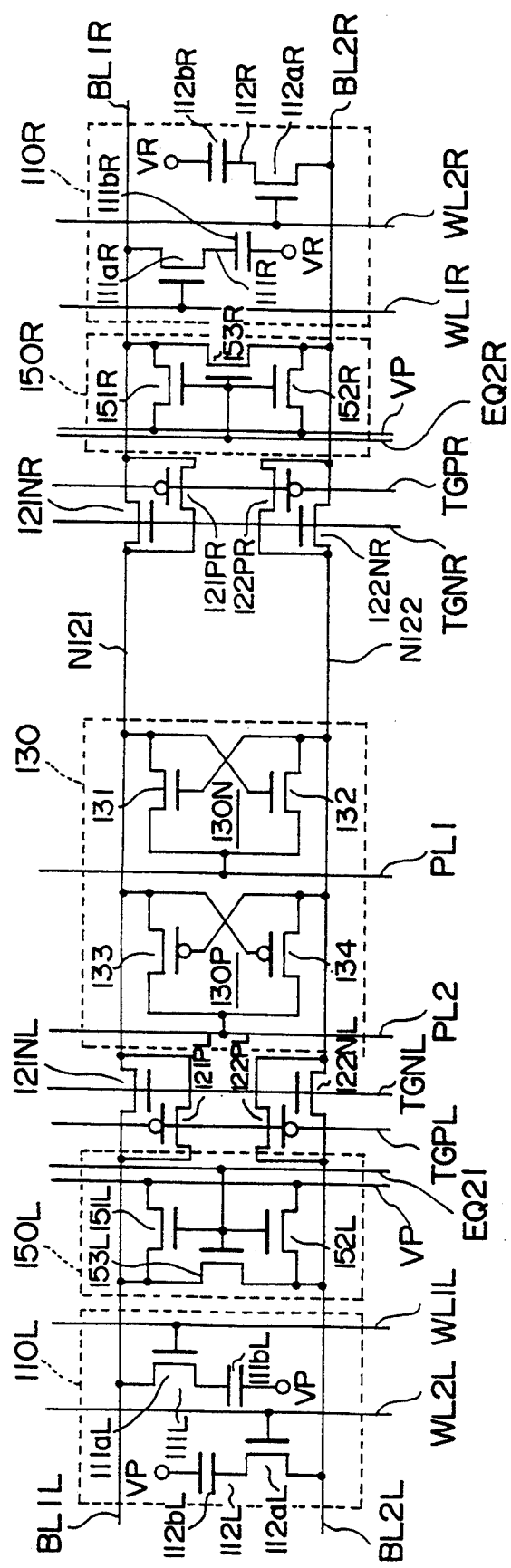
FIG. 13A is a circuit diagram illustrating memory cells and a sense amplifier circuit in a DRAM according to a seventh embodiment of the invention.

FIG. 13A is a circuit diagram illustrating memory cells and a sense amplifier circuit in a DRAM according to a seventh embodiment of the invention. In FIG. 13A, reference numerals common to those in FIG. 11 designate the same or corresponding elements.

The DRAM of FIG. 13A differs from that of FIG. 11 in that the sense amplifier equalizing circuit 140 shown in FIG. 11 is eliminated, and instead, bit line equalizing circuits 150R and 150L are connected, respectively, between the bit lines BL1R, BL2R, and between the bit lines BL1L, BL2L.

Figure 13B:
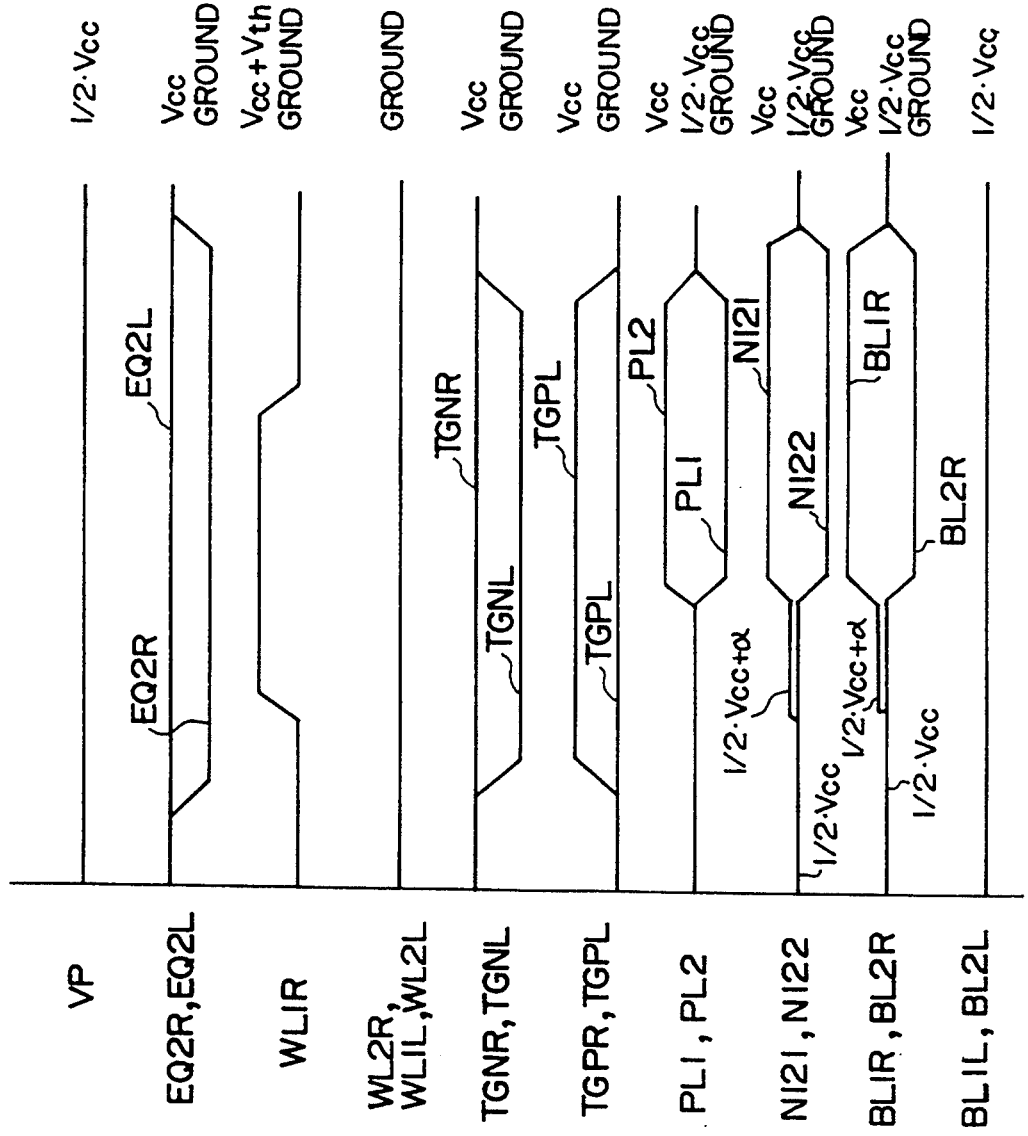
FIG. 13B is a waveform diagram showing the operation of the circuitry illustrated in FIG. 13A.

The operation of the circuitry shown in FIG. 13A, will now be described with reference to the waveform diagram shown in FIG. 13B. To reset the DRAM, the levels of the transfer signals TGNR, TGNL are set to Vcc, the levels of the transfer signals TGPR, TGPL are set to the ground level, and the levels of the equalization signals EQ2R, EQ2L are set to Vcc. Also, the potentials on the word lines WL1R, WL2R, WL1L, WL2L all are set to ground, and the levels of the first and second active signals PL1, PL2 are set to ½.Vcc. As a result, the equalizing circuits 150R, 150L are turned on so that the bit lines BL1R, BL2R, and the bit lines BL1L, BL2L are connected to the equalizing potential VP, through NMOS transistors 151R, 152R of the equalizing circuit 150R and NMOS transistors 151L, 152L of the equalizing circuit 150L, respectively. Therefore, the potentials on the bit lines BL1R, BL2R, and BL1L, BL2L all are set to the ½.Vcc level. The node N121 is connected to the bit line BL1R, through the NMOS transistor 121NR and PMOS transistor 121PR, and is connected to bit line BL1L, through the NMOS transistor 121NL and PMOS transistor 121PL, so that the potential on the node N121 is ½.Vcc. Similarly, the node N122 is connected to the bit line BL2R, through the NMOS transistor 122NR and PMOS transistor 122PR, and is connected to the bit line BL2L, through the NMOS transistor 122NL and PMOS transistor 122PL, so that the potential on the node N122 also is ½.Vcc.

The operation will be further described in the case of selecting, for example, the right side memory cells 110R. At first, the level of the equalization signal EQ2R is shifted to the ground level, while the level of the equalization signal EQ2L is maintained at Vcc. As a result, the equalizing circuit 150R is turned off, but the equalizing circuit 150L remains on, so that the equalizing operation continues on the left side. Further, the levels of the transfer signals TGNL and TGPL are shifted, respectively, to the ground level and Vcc, while the levels of the transfer signals TGNR and TGPR are maintained, respectively, at Vcc and ground. As a result, NMOS transistors 121NL, 122NL and PMOS transistors 121PL, 122PL are turned off, so that the memory cells 110L are not selected. Meanwhile, NMOS transistors 121NR, 122NR and PMOS transistors 121PR, 122PR are turned on, so that the right side memory cells 110R are selected.

The read-out and refresh operations, when the memory cell 111R holds of data value, for example, a logic level "1", will now be described.

The potential on the word line WL1R is shifted from the ground level to a level higher than Vcc+Vth. Charge redistribution then occurs through the NMOS transistor 111aR, based on the capacitance 111bR in the memory cell 111R, and the capacitance of the bit line BL1R, so that the potential on the bit line BL1 rises from the ½.Vcc level to ½.Vcc+α. The potential level on the bit line BL2R remains at ½.Vcc. As a result, the potential on the node N121 is shifted to ½.Vcc+α, through the NMOS transistor 121NR and PMOS transistor 121PR, and the potential on the node N122 remains at ½.Vcc.

Next, the sense amplifier circuit 130 is activated by the active signals PL1, PL2, and accordingly, the potential on the node N121 is shifted from ½.Vcc+α to the Vcc level, while the potential on the node N122 is shifted from ½.Vcc to the ground level. As a result, the potential on the bit line BL1R is shifted from the ½.Vcc+α level to the Vcc level, through the NMOS transistor 121NR and PMOS transistor 121PR, while the potential on the bit line BL2R is shifted from the ½.Vcc level to the ground level, through the NMOS transistor 122NR and PMOS transistor 122PR. Throughout this operation, PMOS transistors 121PR, 122PR are turned on, since the level of the transfer signal TGPR is set to ground. Accordingly, the potentials on the bit lines BL1R, BL2R can be shifted to the Vcc level and ground level, respectively.

Thereafter, by an output from a column decoder (not shown), the nodes N121, N122 are connected to a pair of data busses (not shown), and the stored data is transferred to an output buffer, and is then outputted externally to complete the read-out operation. Further, since the potential on the word line WL1R is set to a level higher than Vcc+Vth, NMOS transistor 111aR of the memory cell 111R is turned on. Accordingly, the potential on the source side node of the NMOS transistor 111aR returns to the Vcc level (the level of the bit line BL1R), thus completing the refresh operation.

To again reset the DRAM, the potential on the word line WL1R is shifted from the level higher than Vcc+Vth to the ground level, thereby turning off the NMOS transistor 111aR, so as to disconnect the first bit line BL1R from the data stored in the data cell. After the levels of the active signals PL1, PL2 are shifted to the ½.Vcc level, the level of the equalization signal EQ2R is shifted to Vcc, such that the equalizing circuit 150R is turned on, so that the potentials on the bit lines BL1R, BL2R are shifted to the ½.Vcc level. Thereafter, the potential on the node N121 is shifted to the ½.Vcc level, through the NMOS transistor 121NR and PMOS transistor 121PR, while the potential on the node N122 is shifted to the ½.Vcc level, through the NMOS transistor 122NR and PMOS transistor 122PR. Further, the transfer signal TGNL is shifted to the Vcc level, while the transfer signal TGPL is shifted to the ground level, thus completing the resetting operation.

When, during the read-out operation, the memory cell 111R holds a logic "0" data value, the potentials on the node N121 and the bit line BL1R are shifted to the ground level, while the potentials on the node N122 and the bit line BL2R are shifted to the Vcc level. The read-out and refresh operations for the data are then completed by procedures substantially similar to those above-described for the data value of logic level "1".

Further, if the left side memory cells 110L are selected, the level of the equalization signal EQ2L is shifted to the ground level, while the level of the equalization signal EQ2R remains at the Vcc level. Also, the transfer signal TGNR is shifted to the ground level and the transfer signal TGPR is shifted to the Vcc level, while the transfer signal TGNL is held at the Vcc level and the transfer signal TGPL is held at the ground level. The read-out and refresh operations then are carried out in a manner similar to that described above for the right side memory cells 110R.

The seventh embodiment offers advantages similar to those of the sixth embodiment.

Eighth Embodiment

Figure 14:
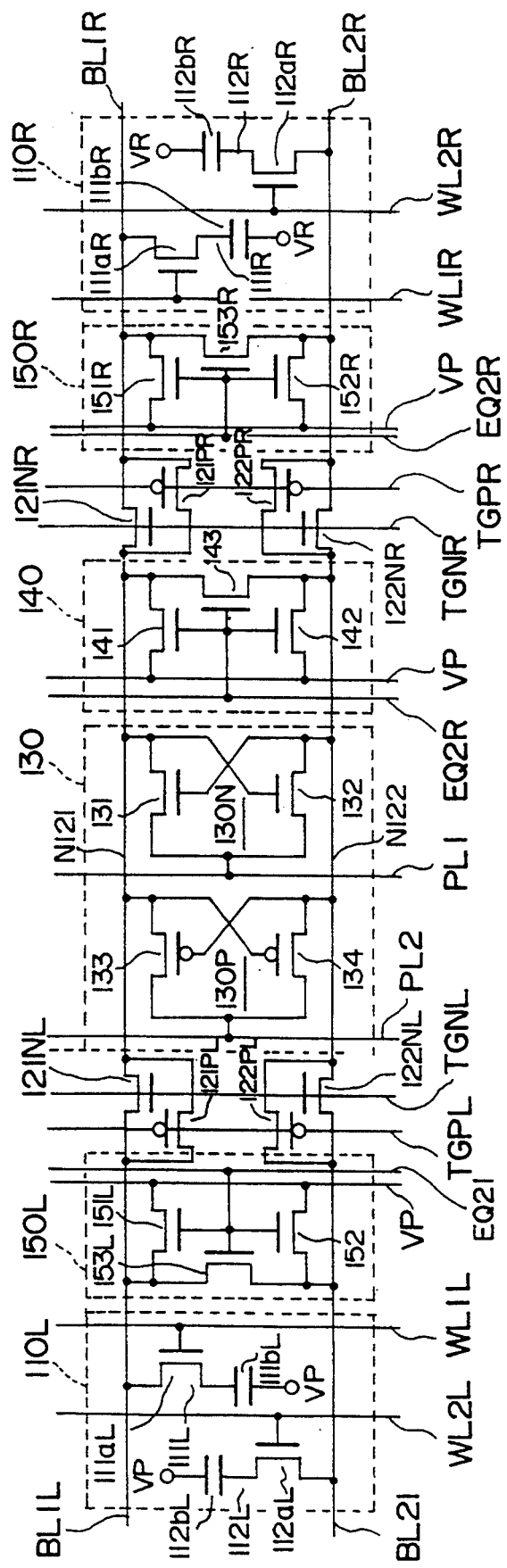
FIG. 14 is a circuit diagram illustrating memory cells and a sense amplifier circuit in a DRAM according to an eighth embodiment of the invention.

FIG. 14 is a circuit diagram illustrating memory cells and a sense amplifier circuit in a DRAM according to an eighth embodiment of the invention. In FIG. 14, reference numerals common to those in FIG. 13A designate the same or corresponding elements. The DRAM of FIG. 14 differs from that of FIG. 13A in that both a sense amplifier equalizing circuit 140, connected to an equalization signal EQ1, and the bit line equalizing circuits 150R, 150L, connected to respective equalization signals EQ2R, EQ2L, are provided.

The DRAM of FIG. 14 performs read-in and refresh operations similarly to the sixth embodiment. However, the DRAM of FIG. 14 carries out the equalizing operation differently than the sixth embodiment: In the equalizing operation of the DRAM of FIG. 14, the equalizing circuits 140, 150R and 150L operate independently of each other so that potentials of the nodes N121, N122, right bit lines BL1R, BL2R and left bit lines BL1L, BL2L are equalized at the ½.Vcc level, independently. Accordingly, delays in shifting the potentials on the right bit lines BL1R, BL2R to the ½.Vcc level, by way of the right transfer gates, and delays in shifting the left bit lines BL1L, BL2L to the ½.Vcc level, by way of the left transfer gates (as may occur during the resetting operation of the DRAM shown in FIG. 11), can be eliminated in the DRAM of FIG. 14.

Similarly, delays in shifting the potentials on the nodes N121, N122 to ½.Vcc, by way of the left and right transfer gates, can also be eliminated in the DRAM of FIG. 14. Thus, in the eighth embodiment, since there are provided a sense amplifier equalizing circuit 140 and bit line equalizing circuits 150R, 150L, which are independent of each other, a delay in the resetting operation of the DRAM can be avoided. Accordingly, the equalizing operation can be speeded up, with the effect that it is possible to shorten the precharge width tPR of a row address strobe signal (RAS), so as to enhance the access speed.

Moreover, the advantages of a shared sense amplifier, as described above with respect to the second embodiment, and the advantages of transfer gates, each in the form of parallel connected PMOS and NMOS transistors, as described above with respect to the third embodiment, are also obtained.

It is noted that the invention is not limited to the above-described embodiments, but various modifications and changes, as will be readily understood by those skilled in the art, can be made thereto, without deviating from the invention, which is limited only by the appended claims. For example, the memory cells 110, 110R, 110L may have other transistor structures, and further, the sense amplifier circuit 130 and equalizing circuits 140, 150, 150R, 150L may have other transistor structures.

What is claimed is:

1. A dynamic random access memory with bit line equalizing circuit, comprising:
 a plurality of pairs of dynamic memory cells, including a first memory cell pair having first and second dynamic memory cells;
 a plurality of word lines, including a first word line pair having first and second word lines for respectively selecting the first memory cell and the second memory cell;
 a plurality of pairs of bit lines, including a first bit line pair having first and second complementary bit lines which cross said first and second word lines, said first memory cell being connected to cross-over portions of said first bit line and said first word line;

a sense amplifier circuit having first and second nodes;

a plurality of pairs of transfer gates, including a first transfer gate pair having first and second transfer gates for respectively connecting the first bit line to the first node and the second bit line to the second node;

a node equalizing circuit means for setting the potentials on the first and second nodes equal to each other, the node equalizing circuit means including first, second, and third transistors, each of the first, second, and third transistors having first, second, and gate electrodes, the first electrodes of the first and second transistors being connected to a potential of one-half of a source voltage level, the second electrode of the first transistor being connected to the first electrode of the third transistor, the second electrode of the second transistor being connected to the second electrode of the third transistor, the first electrode of the third transistor being connected to the first node, the second electrode of the third transistor being connected to the second node, and the gate electrodes of the first, second, and third transistors receiving a first equalizing signal; and said bit line equalizing circuit comprising bit line equalizing circuit means for setting the potentials on the first and second bit lines equal to each other, the bit line equalizing circuit means including fourth, fifth, and sixth transistors, each of the fourth, fifth, and sixth transistors having first, second, and gate electrodes, the first electrodes of the fourth and fifth transistors being connected to potential of one-half of the source voltage level, the second electrode of the fourth transistor being connected to the first electrode of the sixth transistor, the second electrode of the fifth transistor being connected to the second electrode of the sixth transistor, the first electrode of the sixth transistor being connected to the first bit line, the second electrode of the sixth transistor being connected to the second bit line, and the gate electrodes of the fourth, fifth, and sixth transistors receiving a second equalizing signal.

2. A dynamic random access memory according to claim 1, wherein said sense amplifier circuit includes a first sense amplifier which comprises n-channel MOSFET transistors and a second sense amplifier which comprises p-channel MOSFET transistors, said first sense amplifier sensing and amplifying a difference between a first potential on said first node and a second potential on said second node, when the first potential exceeds the second potential, and said second sense amplifier sensing and amplifying a difference between the first potential and the second potential, when the second potential exceeds the first potential.

3. A dynamic random access memory according to claim 1, wherein:

said plurality of pairs of dynamic memory cells additionally include a second memory cell pair having third and fourth dynamic memory cells;

said plurality of pairs of word lines additionally include a second word line pair having third and fourth word lines for respectively selecting the third memory cell and the fourth memory cell;

said plurality of pairs of bit lines additionally include a second bit line pair having third and fourth complementary bit lines which cross said third and fourth word lines, said third memory cell being connected to cross-over portions of said third bit line and said third word line and said fourth memory cell being connected to cross-over portions of said fourth bit line and said fourth word line;

said plurality of pairs of transfer gates additionally include a second transfer gate pair having third and fourth transfer gates for respectively connecting said third bit line to said first node and said fourth bit line to said second node; and said dynamic random access memory further comprises third equalizing circuit means, responsive to a third equalization signal, for setting the potentials on the third and fourth bit lines equal to each other.

4. A dynamic random access memory according to claim 1, wherein said first transfer gate comprises a first n-channel MOSFET transistor and a first p-channel MOSFET transistor, connected to each other in parallel, and wherein said second transfer gate comprises a second n-channel MOSFET transistor and a second p-channel MOSFET transistor, connected to each other in parallel.

5. A dynamic random access memory according to claim 4, wherein said sense amplifier circuit includes a first sense amplifier which comprises n-channel MOSFET transistors and a second sense amplifier which comprises p-channel MOSFET transistors, said first sense amplifier sensing and amplifying a difference between a first potential on said first node and a second potential on said second node, when the first potential exceeds the second potential, and said second sensor amplifier sensing and amplifying a difference between the first potential and the second potential, when the second potential exceeds the first potential.

6. A dynamic random access memory according to claim 4, wherein said MOSFET transistors of said first and second transfer gates have gate electrodes, and the gate electrodes of said n-channel MOSFET transistors of said first and second transfer gates receive a potential of the source voltage level and the gate electrodes of said p-channel MOSFET transistors of said first and second transfer gates receive a potential of a ground voltage level.

7. A dynamic random access memory according to claim 4, wherein:

said plurality of pairs of dynamic memory cells additionally include a second memory cell pair having third and fourth dynamic memory cells;

said plurality of pairs of word lines additionally include a second word line pair having third and fourth word lines for respectively selecting the third memory cell and the fourth memory cell;

said plurality of pairs of bit lines additionally include a second bit line pair having third and fourth complementary bit lines which cross said third and fourth word lines, said third memory cell being connected to cross-over portions of said third bit line and said third word line and said fourth memory cell being connected to cross-over portions of said fourth bit line and said fourth word line; and said plurality of pairs of transfer gates additionally include a second transfer gate pair having third and fourth transfer gates for respectively connecting said third bit line to said first node and said fourth bit line to said second node, said third transfer gate including a third n-channel MOSFET transistor and a third p-channel MOSFET transistor, connected to each other in parallel, and said fourth transfer gate including a fourth n-channel MOSFET transistor and a fourth p-channel MOSFET transistor, connected to each other in parallel.

8. A dynamic random access memory according to claim 7, wherein said MOSFET transistors of said third and fourth transfer gates have gate electrodes, and the gate electrodes of said n-channel MOSFET transistors of said third and fourth transfer gates receive a potential of the source voltage level and the gate electrodes of said p-channel MOSFET transistors of said third and fourth transfer gates receive a potential of a ground voltage level.

9. A dynamic random access memory according to claim 7, further comprising:

third equalizing circuit means, responsive to a third equalization signal, for setting the potentials on the third and fourth bit lines equal to each other.

10. A dynamic random access memory according to claim 1, wherein said second memory cell is connected to cross-over portions of said second bit line and said second word line.

* * * * *